(12) United States Patent
Chu et al.

(10) Patent No.: US 6,490,874 B2
(45) Date of Patent: Dec. 10, 2002

(54) RECUPERATIVE ENVIRONMENTAL CONDITIONING UNIT

(75) Inventors: Richard C. Chu, Poughkeepsie, NY (US); Michael J. Ellsworth, Jr., Lagrangeville, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/742,619

(22) Filed: Dec. 21, 2000

(65) Prior Publication Data

US 2002/0116933 A1 Aug. 29, 2002

(51) Int. Cl.$^7$ ............................................. F25D 17/06
(52) U.S. Cl. ............................................. 62/93; 62/271
(58) Field of Search ...................................... 62/93, 271

(56) References Cited

U.S. PATENT DOCUMENTS

| | | | | |
|---|---|---|---|---|
| 4,350,020 A | * | 9/1982 | Rojey | 62/93 |
| 4,400,948 A | | 8/1983 | Moorehead | 62/3 |
| 4,467,785 A | * | 8/1984 | Langford et al. | 126/400 |
| 5,392,611 A | * | 2/1995 | Assaf et al. | 62/94 |
| 5,426,953 A | * | 6/1995 | Meckler | 62/271 |
| 6,018,954 A | * | 2/2000 | Assaf | 62/94 |
| 6,029,467 A | * | 2/2000 | Moratalla | 62/271 |
| 6,094,835 A | * | 8/2000 | Cromer | 34/80 |
| 6,266,975 B1 | * | 7/2001 | Assaf | 62/476 |

* cited by examiner

Primary Examiner—William C. Doerrler
Assistant Examiner—Mark Shulman
(74) Attorney, Agent, or Firm—Andrew J. Wojnicki, Jr.

(57) ABSTRACT

A method and apparatus for removing moisture from within an electronics enclosure is provided. In particular, dehumidification is accomplished by removing air from the enclosure, cooling the air thereby causing condensation of water vapor from the air, then heating the dehumidified air and returning the heated and dehumidified air to the enclosure. A single heat pump provides cooling and heating functions, effectively recouping heat extracted from the air to be cooled, and transferring the extracted heat to the air prior to its return to the enclosure. In this manner, electronics within the enclosure may be operated at temperatures below the dew point of ambient air surrounding the enclosure, without requiring a thermally insulated enclosure. Devices are provided to collect and purge condensate from the system, either in a continuous or periodic manner. Embodiments employing conventional vapor compression cycle heat pumps and thermoelectric heat pumps are described. A defrost cycle is provided to eliminate frost that may accumulate on the heat exchanger associated with the heat pump normally cold element. Defrost is accomplished by reversing heat pump polarity, heating the normally cold element. Control mechanisms and logic are provided to automate system operation. In preferred embodiments, dehumidification and defrost modes are activated by a controller monitoring the dew point within the enclosure, and the air pressure at the normally cold element. Dehumidification is performed intermittently, when the enclosure dew point exceeds a set point Substantially sealing the enclosure against ingress of ambient air reduces the system's operational duty cycle.

20 Claims, 15 Drawing Sheets

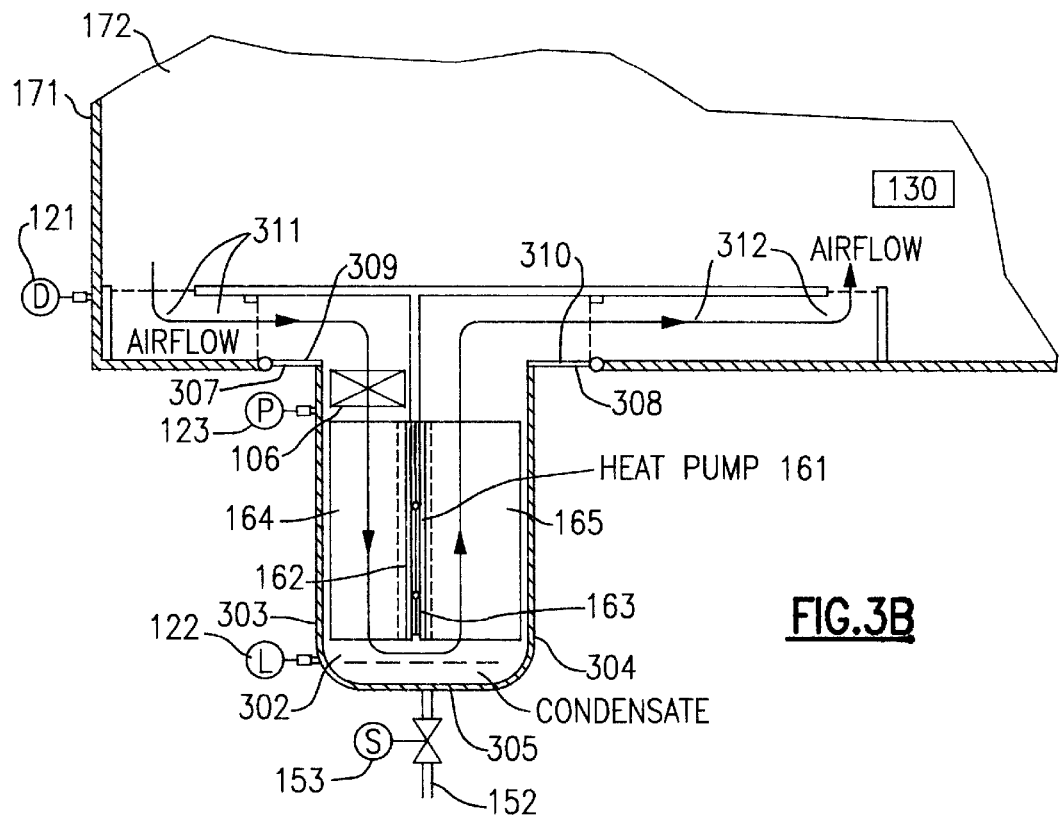
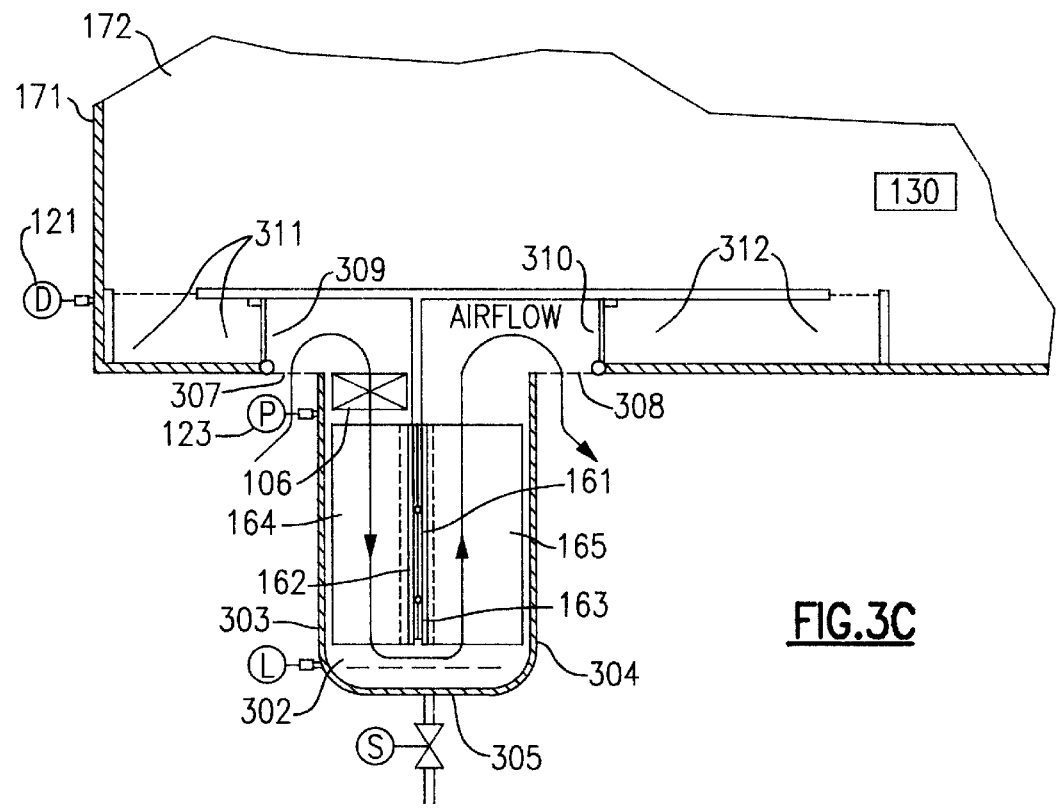

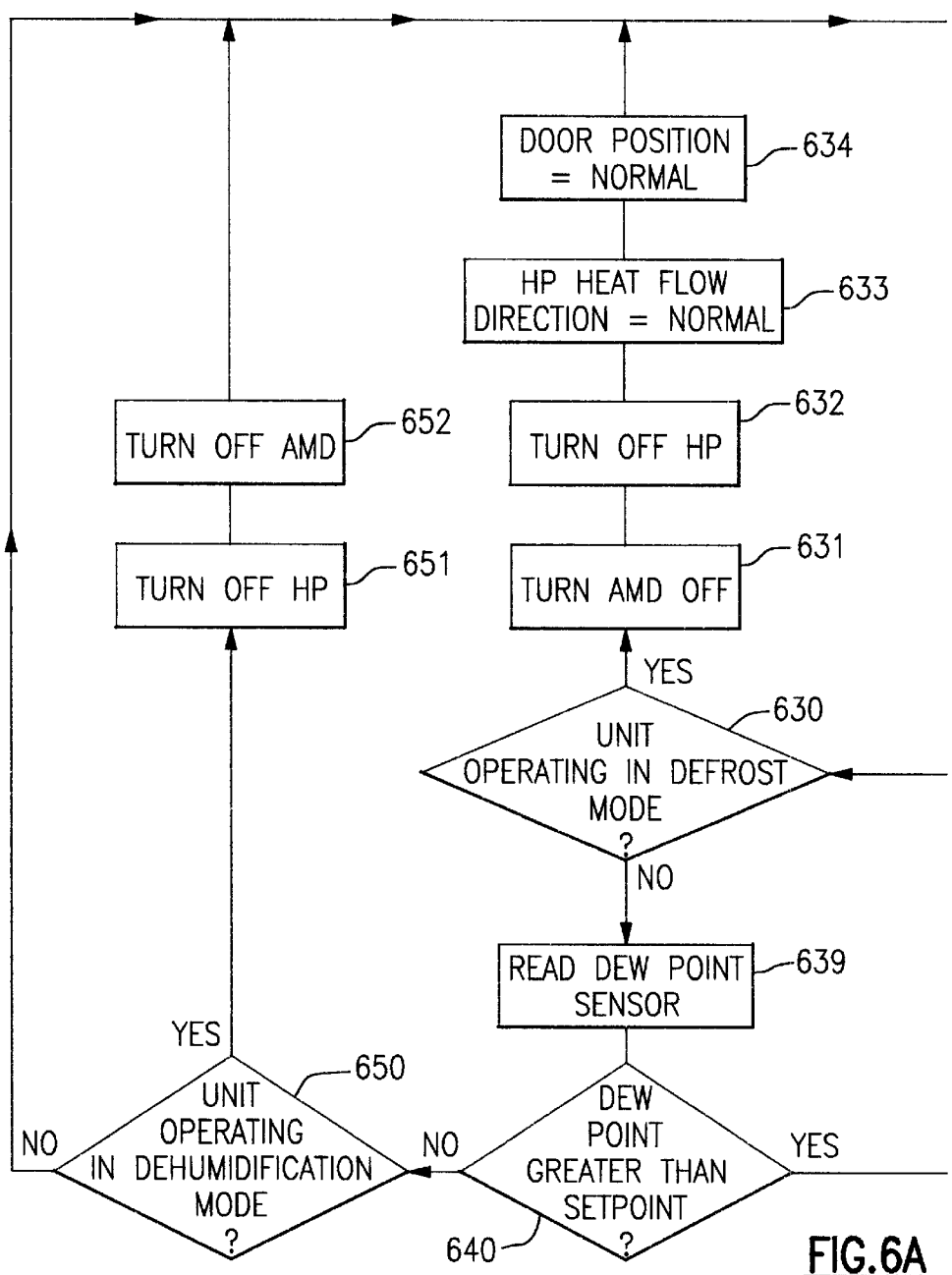

RECUPERATIVE ENVIRONMENTAL CONDITIONING UNIT

BACKGROUND

1. Field of the Invention

The present invention relates, in general, to the removal of moisture from within an electronics enclosure, and in particular to a method and apparatus employing a single heat pump to dehumidify and thermally condition the air within an electronics enclosure.

2. Description of Related Art

Electronic devices, which are cooled to below ambient temperatures and which operate in an environment in which water vapor is present, are subject to condensation problems which may cause corrosion and short circuits. It is therefore desirable to remove water vapor from the environment in which electronic devices operate. While corrosion and short circuiting may be caused by water vapor within the environment surrounding the electronic devices regardless of the device or environment temperatures, the problems intensify for devices operating at lower temperatures, as water vapor may begin to condense on the cooled surfaces of the electronic devices.

As is known, CMOS circuit performance may be improved by reducing the temperatures at which the circuits operate, i.e. the chip junction temperature. As the chip junction temperature decreases, however, the outer surface temperature of the chip package also decreases. The package outer surface includes the electrical interconnections between the package and the next level of assembly, such as a board: the temperature of these interconnections also decreases as chip junction temperature decreases. Heat transfer through these electrical interconnections, therefore, decreases board temperatures. As chip junction temperatures decrease further, eventually the temperature of one or more portions of these exposed surfaces (package outer surface, interconnections, and board) falls below the dew point temperature of the ambient atmosphere surrounding the components. At this point, condensation forms on the module and board surfaces, including electrical interconnections, unless preventive actions are taken. Therefore, dehumidification is highly desirable for environments containing electronic devices operating at temperatures below ambient dew point.

Two basic approaches have been taken to eliminate condensation on cold module surfaces: maintain the external module surfaces at temperatures above room ambient dew point, or condition the atmosphere within the enclosure such that its dew point is lower than the electronic components' external surface temperatures.

The first method, maintaining module surface temperatures above dew point, may be accomplished by providing sufficient insulation around each module, such that the external surface temperature of the insulation remains above room ambient dew point. This approach is discussed in a United States patent application entitled "Inflatable Sealing System for Low Temperature Electronic Module," Ellsworth et al., Ser. No. 09/360,727, having a filing date of Jul. 27, 1999, assigned to the same assignee as the present application and hereby incorporated herein by reference in its entirety, and which is not admitted to be prior art with respect to the present invention by its mention in this Background Section. As the chip temperature decreases, however, more insulation is required around each module to maintain external surface temperatures above the dew point. At some point, as chip temperatures are decreased far below dew point, it may also be necessary to provide auxiliary heaters at the external surfaces of the insulation in order to maintain the module insulation surface temperature above the dew point.

The second method, lowering the dew point of air within the enclosure below the external surface temperature of the cooled modules, prevents condensation without requiring insulation around the modules. This approach is discussed in a United States patent application entitled "Sub-Dew Point Cooling of Electronic Systems," Chu et al., Ser. No. 09/281,135, having a filing date of Mar. 29, 1999, assigned to the same assignee as the present application and hereby incorporated herein by reference in its entirety, and which is not admitted to be prior art with respect to the present invention by its mention in this Background Section. In order to lower the dew point temperature of the ambient atmosphere within the enclosure, some method should be employed to remove moisture from the atmosphere within the enclosure, preferably providing the ability to further remove the moisture from within the enclosure itself. Further, in order to decrease the burden on the moisture removal device, it may be desirable in some applications to provide an enclosure that is at least somewhat sealed against entry of ambient air. While sealing the enclosure may not be required in all applications, a well sealed enclosure requires less frequent (i.e. lower duty cycle) operation of the moisture removal device than would be required in a poorly sealed enclosure.

Depending upon the specific application and the moisture removal method used, the enclosure air temperature may be lowered as a byproduct of the moisture removal process. The temperature reduction may be caused by reduced heat transfer between enclosure air and ambient air, as a result of partially sealing the enclosure against ingress of ambient air. Heat transfer from ambient air to enclosure air tends to mitigate the effect of heat transfer from the enclosure air to the cooled surfaces within the enclosure. Alternatively, the temperature reduction may be caused by the use of a cold heat exchanger to dehumidify the enclosure air. For some applications, the presence of other mitigating factors may maintain the enclosure air temperature within acceptable limits. For other applications, however, continued system operation may result in enclosure air temperatures below room ambient dew point, eventually causing the temperature of the enclosure outer surface to drop below room ambient dew point, resulting in the formation of condensation on the enclosure outer surface.

In such applications, two methods have been employed in the art to prevent condensation from forming on the external surfaces of the enclosure. One method involves insulating the enclosure, such that the external surface remains above ambient dew point. A second method involves the use of an auxiliary heater to heat the enclosure air.

For the foregoing reasons, there is a need for methods and devices capable of preventing the formation of condensation on the cooled surfaces of electronic components, without insulating the electronic components or the enclosure. There is, therefore, a need for methods and devices capable of removing water vapor from the atmosphere within an electronics enclosure and further from the enclosure itself, without lowering the temperature of the atmosphere within the enclosure.

SUMMARY OF THE INVENTION

The present invention is directed to a method and apparatus for conditioning the air within an electronics enclosure, without external condensation, and without the need to insulate the enclosure or to provide an auxiliary heat source. Toward this end, a recuperative environmental conditioning unit is proposed which dehumidifies the air within the enclosure by causing the air to pass over a heat exchanger in thermal contact with the cold element of a heat pump, and reheats the air prior to returning it to the enclosure by causing the air to pass over a heat exchanger in thermal contact with the hot element of the same heat pump. In this way, moisture is removed from the air within the enclosure, eliminating the need for insulation around the electronic components. Since the dehumidified air is warmed prior to returning to the enclosure, the enclosure temperature remains above the room ambient dew point temperature, eliminating the need to insulate the enclosure. Further, since the air is heated by the hot element of the heat pump, no auxiliary heat sources are required. By using the same heat pump to cool and heat the enclosure air, the heat extracted during cooling is recouped. Finally, the conduit forms a sump or collection area, from which the condensate is purgeable to the external environment.

In one embodiment of the present invention, a closed loop air conduit is formed beneath the electronics enclosure. A heat pump is situated beneath the enclosure, each element of the heat pump having a high thermal conductivity path to the air contained within a different portion of the conduit. An air moving device causes air to circulate from the enclosure into an inlet port of the conduit, through the inlet side of the conduit, through a sump or condensate collection section of the conduit, then through the outlet side and outlet port of the conduit, and finally from the outlet port back to the enclosure. Within the inlet side, the air flows through a heat exchanger in thermal contact with the normally cold element of the heat pump, cooling the air and causing moisture to condense on the normally cold heat exchanger. Within the outlet side, the air flows through a heat exchanger in thermal contact with the normally hot element of the heat pump, heating the air prior to its return to the enclosure. As condensate collects on the normally cold heat exchanger, it falls from the heat exchanger and is collected in the sump portion of the conduit. A mechanism, such as a valve or a wick, which allows periodic removal of the condensate is disposed near the bottom of the sump. A mechanism such as a baffle is provided within the enclosure to cause air entering the enclosure from the conduit outlet port to circulate around the enclosure before reentering the conduit inlet port.

In another embodiment of the present invention, the recuperative environmental conditioning unit is disposed entirely within the enclosure: only the mechanism which removes condensate from the sump area, or some portion of this mechanism, extends outside of the enclosure.

In another embodiment of the present invention, the heat pump device is a vapor compression cycle heat pump. In a preferred embodiment, the heat pump is a thermoelectric device.

In other embodiments of the present invention, air circulation within the enclosure is accomplished by extending the conduit inlet port or the conduit outlet port, or both, so as to cause air to return to the enclosure some distance away from the location where the conduit removes air from the enclosure. In this way, air entering the enclosure from the extended outlet port circulates through the enclosure prior to entering the conduit inlet port, thus eliminating the need for an airflow baffle.

In preferred embodiments of the present invention, control mechanisms are provided to handle certain functions. In one aspect, a humidity or dew point sensor measures the humidity within the enclosure, and a controller monitoring the humidity sensor activates the heat pump and air moving device when humidity within the enclosure exceeds a setpoint. The controller continues to monitor the sensor, deactivating the heat pump and air moving device when the dew point is at or below a setpoint. In another aspect, a control mechanism operates the condensate removal valve when the condensate level reaches an upper threshold.

In a preferred embodiment of the present invention, a defrost mode is provided to remove frost from the normally cold heat exchanger. The defrost mode may be initiated and terminated manually; however, in preferred embodiments a controller monitors a sensor to identify a restricted airflow condition at the normally cold heat exchanger, restricted airflow being indicative of frost accumulation on the heat exchanger. Upon detection of such a condition, the controller initiates the defrost mode. During defrost, the controller reverses the direction of heat flow through the heat pump, causing heat to flow from the normally hot element to the normally cold element. At the same time, the controller initiates a change in airflow at the inlet and outlet sides of the conduit. The conduit inlet side, normally in airflow communication with the conduit inlet port, is now sealed off from the inlet port (and therefore from the enclosure) and put in airflow communication with an ambient inlet vent, the ambient inlet vent being in airflow communication with the ambient air surrounding the enclosure. In analogous fashion, the conduit outlet side, normally in airflow communication with the conduit outlet port, is sealed off from the outlet port (and therefore from the enclosure) and is placed in airflow communication with an ambient outlet vent, the ambient outlet vent being in airflow communication with the ambient air surrounding the enclosure. As a result of these changes, air no longer flows to and from the enclosure, the enclosure being sealed off from the inlet and outlet sides of the conduit. During defrost, room ambient air enters through the ambient inlet vent, into the conduit inlet side, where it flows over the normally cold (now hot) heat exchanger, through the sump, over the normally hot (now cold) heat exchanger, and finally through the outlet side and ambient outlet vent, into the ambient environment. The controller terminates the defrost mode upon determining that the restricted airflow condition has been eliminated. The controller then returns the system to its normal operating state: the conduit is sealed off from the ambient, the conduit inlet side is placed in airflow communication with the inlet port, the conduit outlet side is placed in airflow communication with the outlet port, thereby restoring airflow between the enclosure and the conduit, and the heat pump is again reversed such that the heat pump causes heat to flow from the normally cold element to the normally hot element.

In preferred embodiments employing control mechanisms to initiate dehumidification and defrost, contention is managed by prioritizing the defrost process.

It is therefore an object of the present invention to provide a method and apparatus to remove moisture from within an electronics enclosure, without lowering the temperature of the air within the enclosure.

It is a further object of the present invention to accomplish the moisture removal with a single heat pump, heating the dehumidified air prior to returning the air to the enclosure, without the use of an auxiliary heat source.

It is a further object of the present invention to automate the moisture removal process, by monitoring the moisture levels within the enclosure and activating the conditioning unit when the dew point exceeds a threshold.

It is a further object of the present invention to provide an automatic mechanism for removing condensate from the enclosure.

It is a still further object of the present invention to provide an automated defrost cycle, to remove frost from the normally cold heat pump element, venting the resulting vapor to the external environment.

The recitation herein of a list of desirable objects which are met by various embodiments of the present invention is not meant to imply or suggest that any or all of these objects are present as essential features, either individually or collectively, in the most general embodiment of the present invention or in any of its more specific embodiments.

Additional features and advantages are realized through the techniques of the present invention. Other embodiments and aspects of the invention are described in detail herein, and are considered part of the claimed invention.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 3B shows a side detail view of the RECU of FIG. 3A in normal operation;

FIG. 3C shows a side detail view of the RECU of FIG. 3A, in defrost mode;

DETAILED DESCRIPTION OF THE INVENTION

Figure 1A:
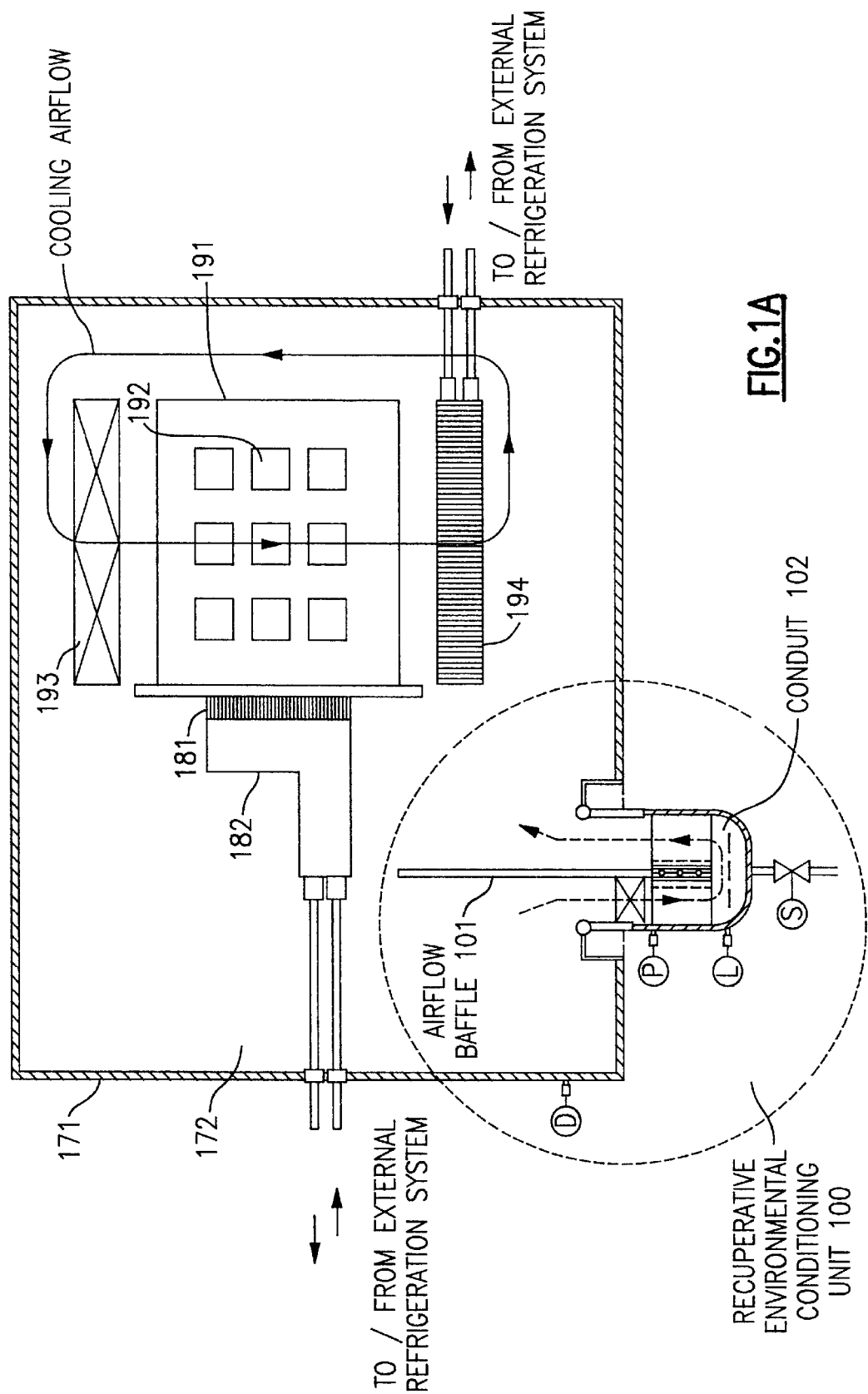
FIG. 1A shows a side view of an electronics enclosure with an external recuperative environmental conditioning unit (RECU) according to one embodiment of the present invention.

FIG. 1A illustrates the environment in which the recuperative environmental conditioning unit (RECU) of the present invention functions. The environment comprises an enclosure 171, containing an electronics compartment 172. Enclosure 171 is substantially sealed against ingress of ambient air, however a hermetic seal is not required. Compartment 172 may contain electronic modules 192 cooled by forced air, or electronic modules 181 in thermal contact with an evaporative cooler 182, or both as shown. Forced air cooling is accomplished by using one or more air moving devices 193 to create a cooling airflow over the modules 192 and board 191, thereby removing heat from modules 192 and board 191. The heated air then passes through an evaporative cooler 194, transferring heat from the air to the cooling fluid within the evaporative cooler 194. The cooled air circulates back through the air moving device 193, then back over the modules 192 and board 191. Evaporative cooler 182, in thermal contact with module 181, transfers heat from module 181 to the cooling fluid within the evaporative cooler 182. The evaporative coolers 182 and 194 are as known in the art, each having fluid connections to and from an external refrigeration system.

FIG. 1A further illustrates the design and placement of RECU 100 within the electronics environment, per one embodiment of the present invention. As shown in FIG. 1A, RECU 100 comprises a closed loop conduit 102, extending below the enclosure, and an airflow baffle 101 extending upwards into the enclosure. As illustrated by the arrow indicating the flow of air through conduit 102, airflow baffle 101 causes air exiting conduit 102 to circulate through compartment 172 prior to reentering conduit 102.

Figure 1B:
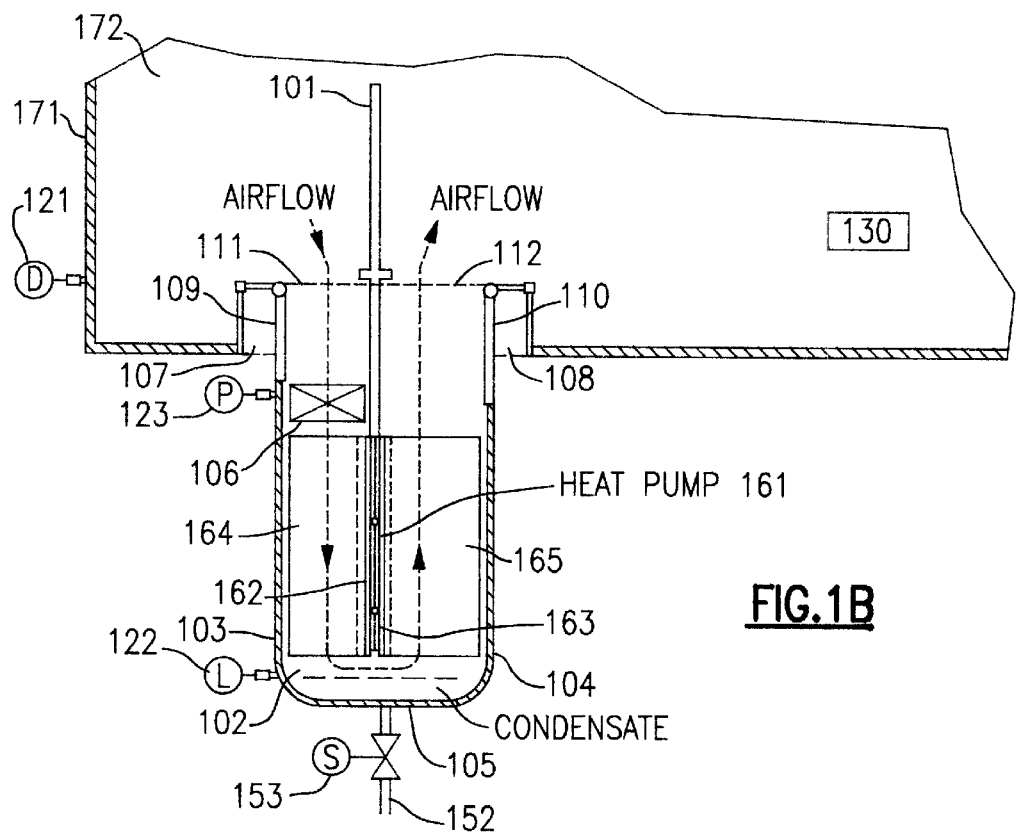
FIG. 1B shows a side detail view of the RECU of FIG. 1A in normal operation.

FIG. 1B provides a detailed view of the embodiment of FIG. 1A during normal operation. Conduit 102 is comprised of several sections: an inlet port 111, a conduit inlet side 103, a conduit sump 105, a conduit outlet side 104, and an outlet port 112. The inlet port 111 is in airflow communication with the electronics compartment 172, and also with the conduit inlet side 103. The conduit inlet side 103 is further in airflow communication with conduit sump 105, sump 105 also being in airflow communication with conduit outlet side 104. Conduit outlet side 104 is further in airflow communication with outlet port 112, outlet port 112 also being in airflow communication with electronics compartment 172. A closed loop airflow is therefore provided from compartment 172, through inlet port 111, inlet side 103, sump 105, outlet side 104, outlet port 112, and finally back to compartment 172.

Air circulation through the closed loop conduit 102 is provided by air moving device 106. In the embodiment of FIG. 1B, air moving device 106 is placed within the conduit inlet side 103, between inlet port 111 and normally cold heat exchanger 162. Alternatively, air moving device 106 could be placed within the conduit outlet side 104.

Figure 2A:
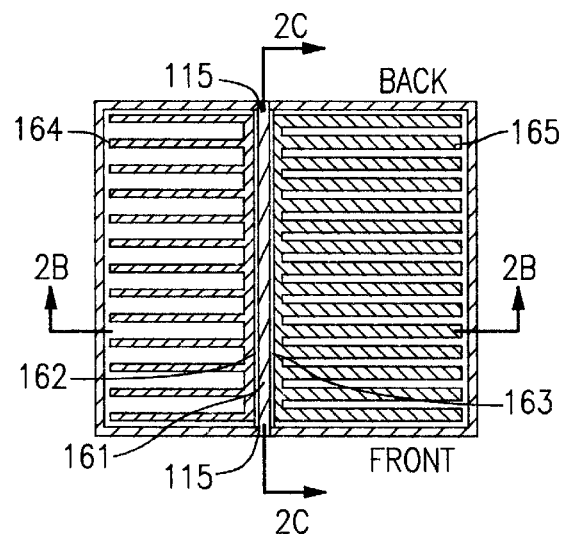
FIG. 2A shows a plan view of the thermoelectric heat pump and heat exchangers according to one embodiment of the present invention.
Figures 2B, 2C:
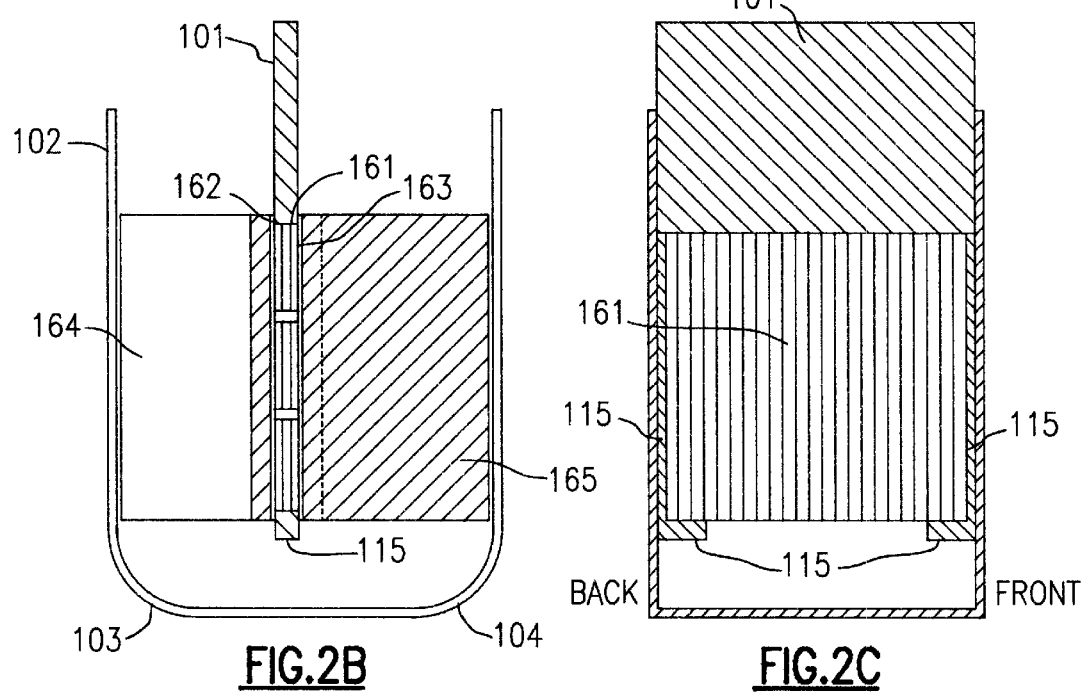
FIG. 2B shows a cutaway view of the thermoelectric device depicted in FIG. 2A, taken along lines B—B.
FIG. 2C shows a cutaway view of the thermoelectric device depicted in FIG. 2A, taken along lines C—C.

In the embodiment of FIG. 1B, airflow baffle 101 performs two functions. As previously noted, the portion of baffle 101 extending into compartment 172 causes air exiting conduit 102 through outlet port 112, to circulate through compartment 172 prior to reentering conduit 102 through inlet port 111. In addition, the portion of baffle 101 extending inside the conduit (i.e. between heat pump 161 and ports 111 and 112) extends from the front to the rear wall of the conduit 102 of FIG. 1B, as shown in FIG. 2C. Baffle 101 may be sealed or bonded to the front and rear walls of conduit 102, or may merely be in contact with the front and rear walls of conduit 102, thus preventing airflow communication between the inlet side 103 and outlet side 104, in the space above heat pump 161. Baffle 101 therefore prevents an airflow short-circuit, insuring that air entering the inlet port flows through the length of inlet side 103, through sump 105, through the length of outlet side 104, prior to exiting the conduit through outlet port 112.

Two additional features are shown near each port 111 and 112. Inlet door 109 and ambient inlet vent 107 are disposed near inlet port 111 and inlet side 103. Outlet door 110 and ambient outlet vent 108 are disposed near outlet port 112 and outlet side 104. The purpose of these features will be fully described in the discussion of defrost mode. During normal operation, inlet door 109 is in the position shown in FIG. 1B, sealing off ambient inlet vent 107. In analogous fashion, outlet door 110 is in the position shown in FIG. 1B during normal operation, sealing off ambient outlet vent 108.

In preferred embodiments, heat pump 161 is a thermoelectric device. Thermoelectric heat pump 161 is placed within conduit 102, as shown in FIG. 1B. In the alternative, the heat pump is a vapor compression cycle heat pump, as discussed below and illustrated in FIGS. 8A through 8D. Power is supplied to the heat pump through any convenient means, such as the electronics complex within enclosure 171, or any convenient external source. During normal operation, the heat pump 161 causes heat to flow from the normally cold element 162 to the normally hot element 163. The normally cold element 162 is in thermal contact with the normally cold heat exchanger 164, and the normally hot element 163 is in thermal contact with the normally hot heat exchanger 165. FIGS. 2A through 2C provide additional details of the thermoelectric heat pump 161. As shown in FIG. 2A, heat pump 161, elements 162 and 163, and heat exchangers 164 and 165 extend substantially but not completely from the front to the back wall of conduit 102. In addition, the normally cold heat exchanger 164 extends substantially but not completely to the wall of conduit inlet side 103. In analogous fashion, the normally hot heat exchanger 165 extends substantially but not completely to the wall of conduit outlet side 104. As a result, there is limited thermal contact between any portion of conduit 102 and heat pump 161, elements 162 or 163, or heat sinks 164 or 165.

Mechanical support for heat pump 161 may be provided by a seal or other mechanism connecting heat pump 161 and/or elements 162 and 163 to the wall of conduit 102. In preferred embodiments, the mechanical support limits thermal conduction between conduit 102 and the heat pump 161 and its elements 162 and 163. Also, in preferred embodiments, a mechanical support such as a seal provides additional airflow isolation of the conduit inlet side from the conduit outlet side, along the length of heat pump 161. One possible embodiment is illustrated in FIGS. 2A through 2C, showing rail 115 connecting to the front and back walls of conduit 102. As shown, rail 115 provides mechanical support for the sides and some portion of the bottom of heat pump 161. In preferred embodiments, rail 115 simplifies field servicing by allowing easy insertion and removal of heat pump 161.

As shown in FIGS. 2A and 2B, the normally cold heat exchanger 164 is in thermal contact with the air within conduit inlet side 103, however heat exchanger 164 is not in direct thermal contact with the walls of conduit inlet side 103. Similarly, the normally hot heat exchanger 165 is in thermal contact with the air within conduit outlet side 104, however heat exchanger 165 is not in direct thermal contact with the walls of conduit outlet side 104. During normal operation, therefore, heat pump 161 causes heat to flow from the air within conduit inlet side 103 to normally cold heat exchanger 164, to normally cold element 162, through heat pump 161, to normally hot element 163, to normally hot heat exchanger 165, and finally to the air within conduit outlet side 104. Through this process, the air entering conduit 102 is cooled as it passes through inlet side 103, and is heated as it passes through outlet side 104.

In preferred embodiments, the normally hot heat exchanger 165 is designed such that it provides greater heat transfer than the normally cold heat exchanger 164. As a byproduct of pumping heat from the normally cold element 162 to the normally hot element 163, heat pump 161 creates some quantity of waste heat (i.e. joule heating). As a result, heat exchanger 165 should be designed such that it provides heat transfer capabilities sufficient to transfer to the air within the outlet side a quantity of heat equal to the heat which is removed from the air within the inlet side plus the waste heat which is generated by the heat pump 161. While optional, this design consideration becomes increasingly important as the duty cycle of RECU 100 increases, such as when enclosure 171 is poorly sealed against entry of ambient air. The embodiment illustrated in FIGS. 2A and 2B displays this feature: normally hot heat exchanger 165 is designed for greater thermal transfer than normally cold heat exchanger 164.

FIG. 1B illustrates several control features, to be discussed in detail below. These control features include sensing devices (dew point sensor 121, liquid level sensor 122, pressure sensor 123), a controller 130, and solenoid valve 153.

RECU Normal Operation

Normal operation of the embodiment illustrated in FIG. 1A will now be described, with reference to FIG. 1B.

During normal operation, RECU 100 removes humidity from compartment 172. While manual operation of RECU 100 is possible, preferred embodiments employ control mechanisms to monitor the dew point within the compartment 172, causing RECU 100 to operate when the dew point exceeds a predetermined setpoint. RECU 100 should operate intermittently, i.e. at a duty cycle less than 1. To lower the RECU operational duty cycle, enclosure 171 should be substantially sealed against ingress of ambient air. A better seal results in a lower RECU duty cycle. A hermetically sealed enclosure is not required.

When RECU 100 is in normal operation, power is supplied to heat pump 161 and air moving device 106. Heat pump 161 causes heat to flow from normally cold element 162 to normally hot element 163, in turn causing heat to flow from normally cold heat exchanger 164 to normally cold element 162, and from normally hot element 163 to normally hot heat exchanger 165. In this manner, the temperature of normally cold heat exchanger 164 is lowered, and the temperature of normally hot heat exchanger 165 is raised. Air moving device 106 causes air to flow from electronics compartment 172, through inlet port 111, through inlet side 103 and over normally cold heat exchanger 164. As air passes over normally cold heat exchanger 164, water vapor condenses on the cold surfaces of heat exchanger 164.

Figure 7:
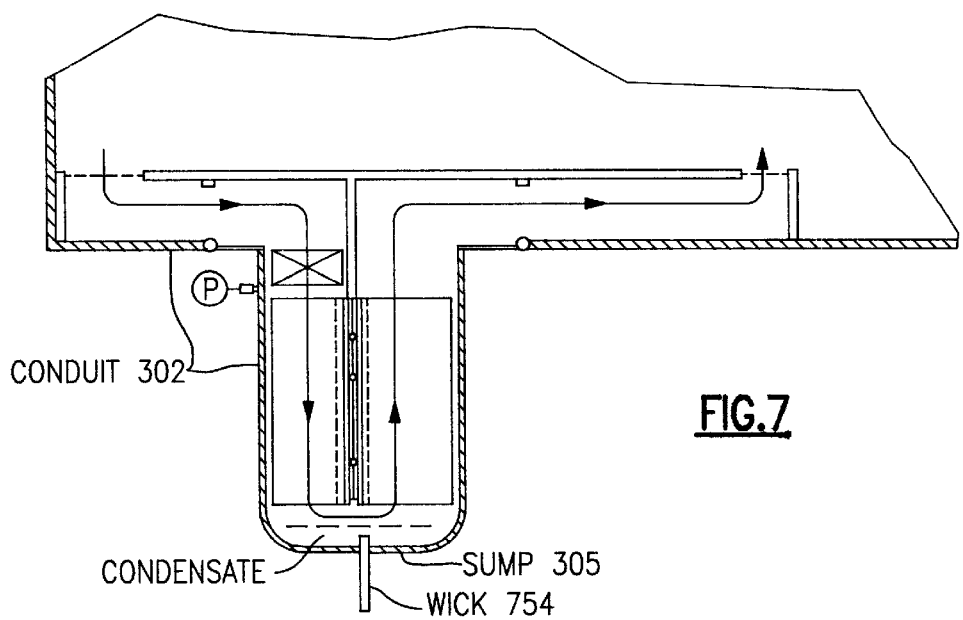
FIG. 7 shows the RECU of FIG. 3A, using a wick to remove condensate.

Condensate accumulates on heat exchanger 164, and eventually falls into a collection area, conduit sump 105. Condensate accumulates in sump 105 until it is removed. A mechanism to remove condensate is disposed near the lowest point of sump 105. This mechanism may be a device such as a valve or a wick. If a valve is used to remove condensate, the valve may be operated manually, or in preferred embodiments a solenoid valve 153 is used to enable automatic control. In either case, the valve allows condensate to flow from sump 105 to condensate drain 152, for subsequent disposal. If a wick is used, condensate drain 152 and additional control mechanisms are not required. FIG. 7 illustrates one such embodiment, showing wick 754 disposed substantially at the lowest point of sump 305. As shown, wick 754 provides continuous removal of condensate without the need for manual or automated control.

As air passes through normally cold heat exchanger 164 during normal operation, the air temperature and humidity are both reduced. Upon exiting the conduit inlet side 103, air flows through sump 105 and then enters conduit outlet side 104. While flowing through outlet side 104, air flows through normally hot heat exchanger 165. Heat exchanger 165 transfers heat to the air, raising its temperature. As noted previously, the normally hot heat exchanger 165 transfers to the air the waste heat which is generated by the heat pump, in addition to the heat which is removed from the air by the normally cold heat exchanger 164. This results in a net increase in the temperature of air exiting outlet port 112, compared to air entering inlet port 111.

Under normal operation as illustrated in FIG. 1B, therefore, RECU 100 removes moisture from compartment 172, without lowering the temperature of the air within compartment 172.

RECU Defrost Mode

Defrost mode operation of the embodiment illustrated in FIG. 1A will now be described, with reference to FIG. 1C.

In some applications, condensate may freeze on the surface of the normally cold heat exchanger 164. Continued accumulation of such frost on the normally cold heat exchanger 164 eventually impedes airflow through the normally cold heat exchanger, thus degrading the performance of the RECU. Two factors that may increase the likelihood of frost are the temperature of the normally cold heat exchanger 164 (low temperature increases the likelihood of frost), and RECU duty cycle (high duty cycle increases the likelihood of frost). For applications prone to frost accumulation, preferred embodiments of the present invention provide a defrost mode. During the defrost mode, the polarity of the heat pump 161 is reversed, causing the normally cold element 162 to become hot, and the normally hot element 163 to become cold. In addition, inlet and outlet doors provide airflow to and from the conduit 102 and the ambient environment, while eliminating airflow to and from the conduit 102 and the compartment 172.

Figure 1C:
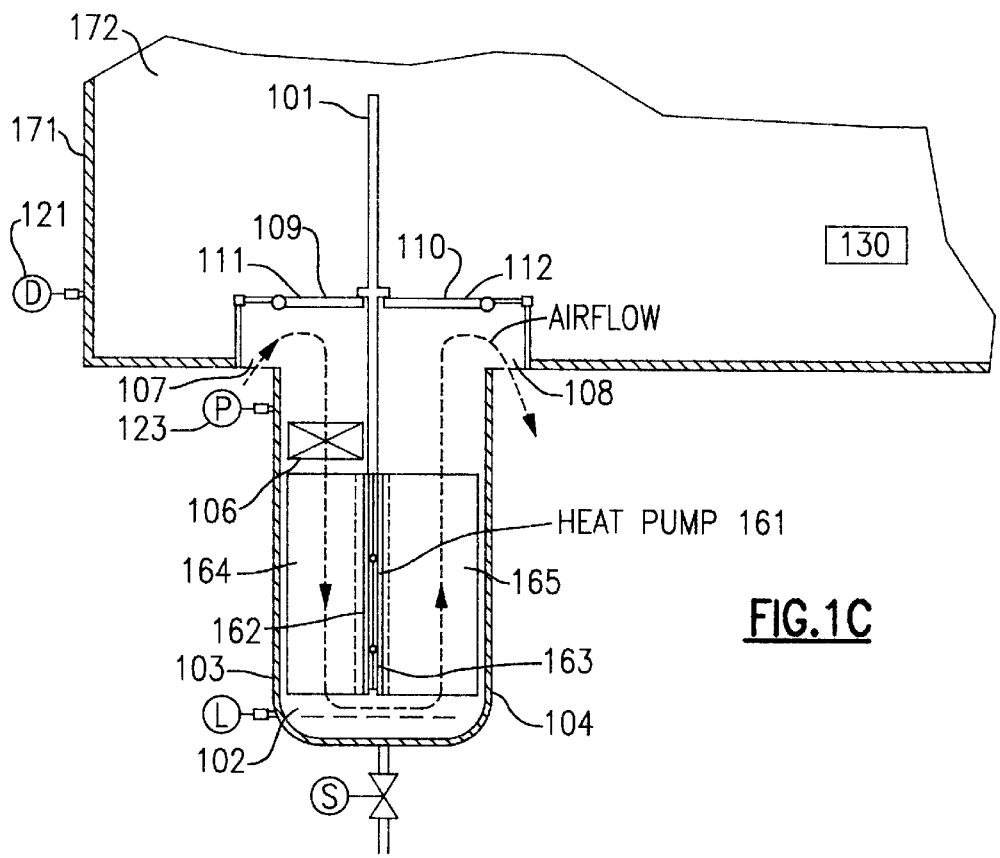
FIG. 1C shows a side detail view of the RECU of FIG. 1A, in defrost mode.

FIG. 1C depicts the operation of the RECU 100 during defrost mode. In preferred embodiments of the present invention, heat pump 161 is a thermoelectric device. Reversing the direction of heat flow is easily accomplished by reversing the polarity of the voltage supply providing power to the thermoelectric heat pump 161. Once the supply voltage polarity is reversed, providing power to heat pump 161 causes heat to flow from the normally hot element 163 to the normally cold element 162. Heat then flows from normally cold element 162 to normally cold heat exchanger 164. The normally cold element 162 and normally cold heat exchanger 164 become hot, and the normally hot element 163 and normally hot heat exchanger 165 become cold. The heat which is provided to the normally cold heat exchanger 164 melts the frost on normally cold heat exchanger 164.

A second change occurs during defrost mode, to insure that the moisture from the melting frost is vented to the ambient environment. FIG. 1C illustrates inlet door 109 and outlet door 110 in their defrost mode positions. In defrost mode, inlet door 109 swings toward inlet port 111, eliminating airflow communication between inlet port 111 and inlet side 103. With inlet door 109 in the defrost position, ambient inlet vent 107 is now in airflow communication with inlet side 103. Air moving device 106 now causes air to flow from the ambient environment, through ambient inlet vent 107, then into inlet side 103. In similar fashion, outlet door 110 swings toward outlet port 112, eliminating airflow communication between outlet side 104 and outlet port 112. With outlet door 110 in the defrost position, ambient outlet vent 108 is now in airflow communication with outlet side 104. Air flowing through the inlet side 103, therefore, flows through sump 105, through outlet side 104, through ambient outlet vent 108 and finally back into the ambient environment surrounding the enclosure 171. In this manner, water vapor which is created by heating the frost on normally cold heat exchanger 164 is vented into the ambient environment, rather than into electronics compartment 172.

As illustrated in FIGS. 1B and 1C, inlet door 109 comprises a single door on a hinge-like pivot mount. Inlet door 109 swings or pivots into one position during normal operation and a second position during defrost operation. Alternative embodiments are also envisioned, wherein inlet door 109 may be replaced by two doors: one to seal or open inlet port 111 and a second to seal or open ambient inlet vent 107. These inlet doors may also be replaced by louvers or other such devices. Further, embodiments are envisioned in which the inlet door or doors are mounted other than with a hinge or pivot, such as by using a sliding mount. Similar embodiments for outlet door 110 are envisioned, in keeping with the spirit and scope of the present invention.

Upon removal of the frost accumulation from normally cold heat exchanger 164, the defrost cycle is terminated. Air moving device 106 and heat pump 161 are turned off. The heat pump polarity is again reversed, by reversing the polarity of the thermoelectric heat pump 161 supply voltage. Finally, inlet door 109 and outlet door 110 are returned to their normal operating position, as shown in FIG. 1B. Inlet door 109 now seals inlet side 103 from ambient inlet vent 107, and restores airflow communication between inlet side 103 and electronics compartment 172. In similar fashion, outlet door 110 swings into normal position sealing outlet side 104 from ambient outlet vent 108, and restoring airflow communication between outlet side 104 and outlet port 112. These changes return the RECU to normal operating condition, ready to remove moisture from the environment within compartment 172.

RECU Control

Figure 5:
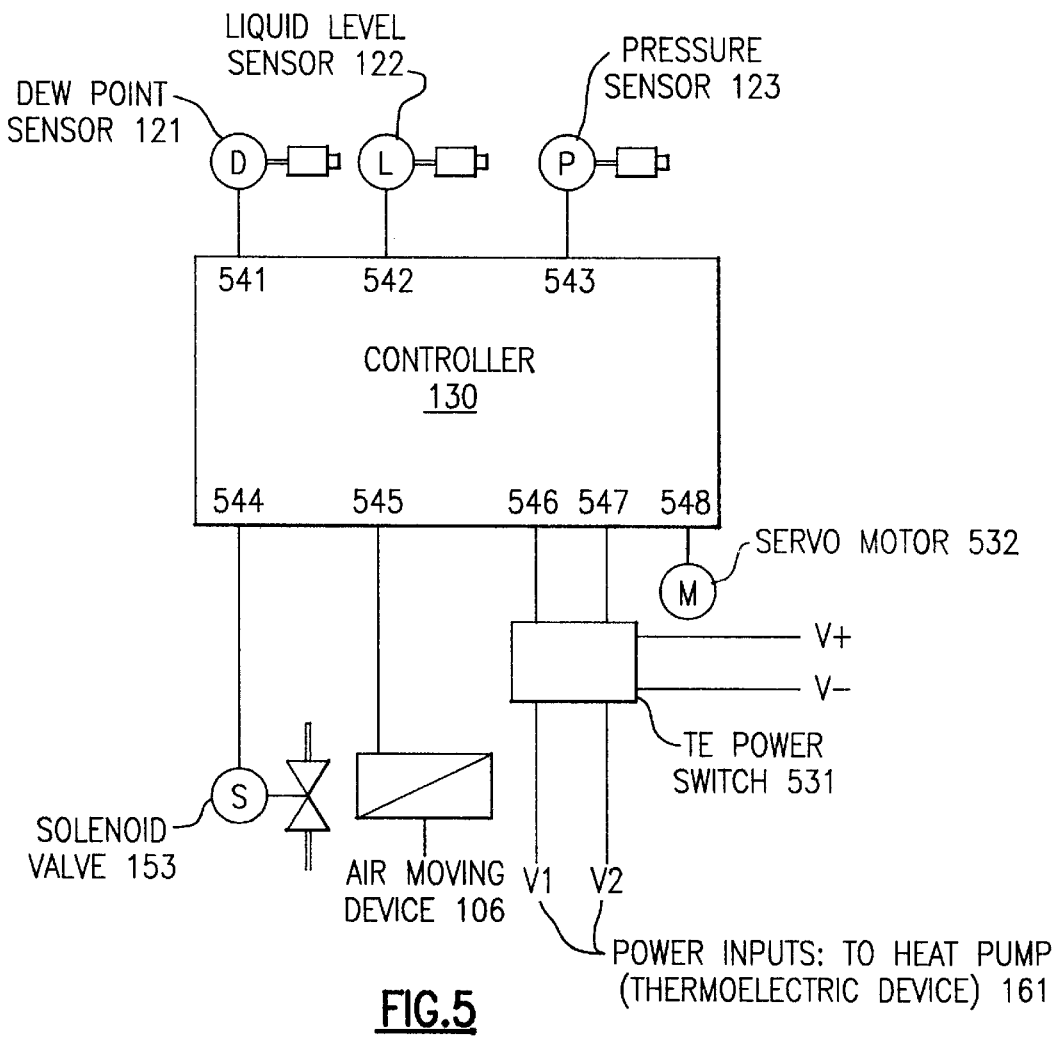
FIG. 5 shows a schematic view of the control devices of one embodiment of the present invention.
Figure 6B:
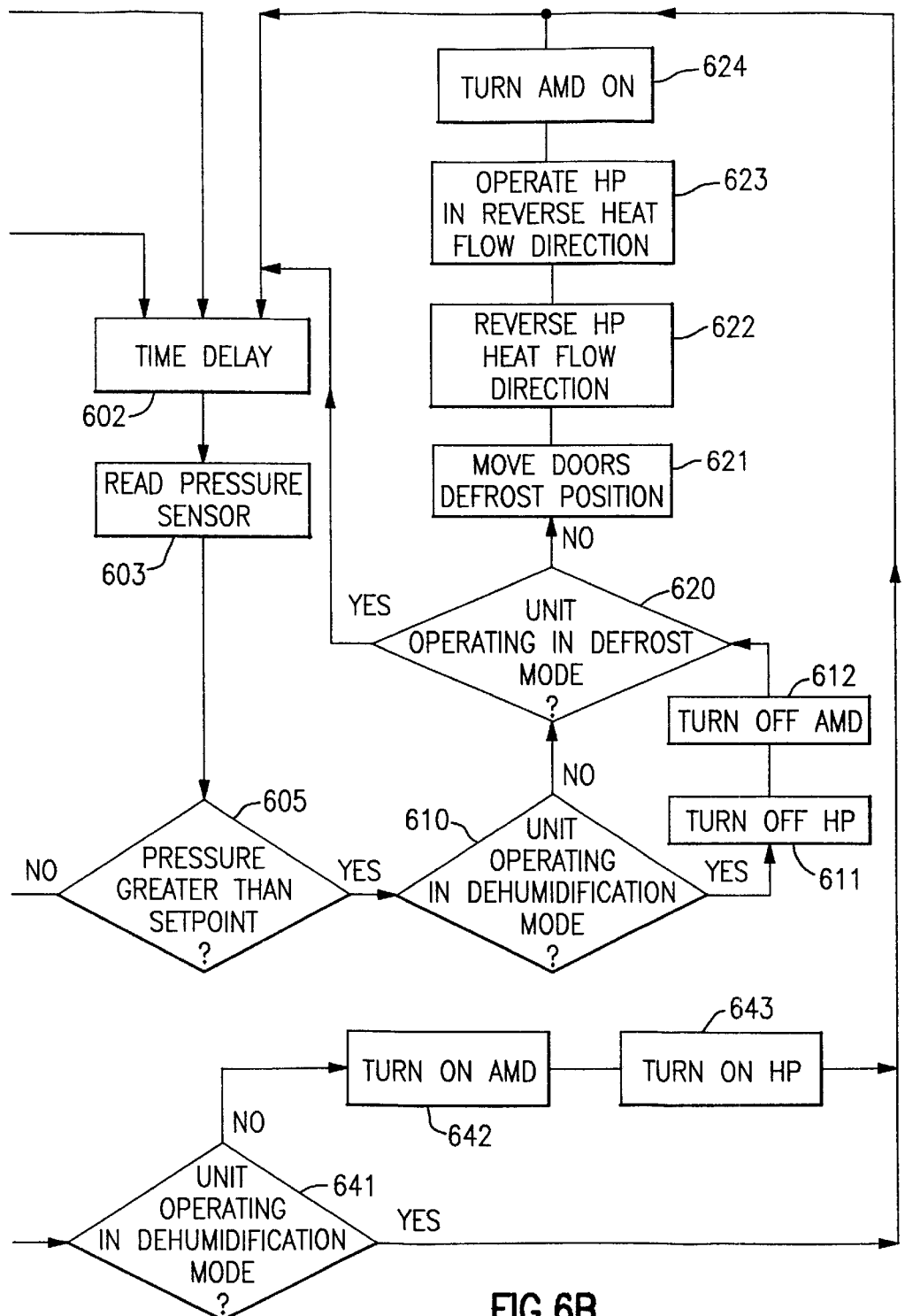
FIG. 6 shows a flow diagram depicting the RECU control flow, for both the dehumidification and the defrost operations according to one embodiment of the present invention.

In preferred embodiments of the present invention, control mechanisms are provided to manage many of the RECU operations. FIG. 1B depicts the devices which are involved in controlling the RECU: dew point sensor 121, liquid level sensor 122, pressure sensor 123, controller 130, and solenoid valve 153. FIG. 1B illustrates placement of controller 130 within enclosure 171, an alternative placement of controller 130 is possible, such as within a separate unit near or attached to RECU 100. In similar fashion, power may be supplied to controller 130 from the electronics complex within enclosure 171, or from any convenient source. FIG. 5 depicts a schematic representation of the control device connections, and introduces the thermoelectric (TE) power switch 531. Switch 531 performs two functions in embodiments employing a thermoelectric heat pump: polarity control and on/off switching. FIG. 6 illustrates the main control logic which manages a preferred embodiment of the present invention.

In preferred embodiments of the present invention, the control devices and logic manage three RECU operations: starting and stopping normal operation (dehumidification), starting and stopping defrost mode, and purging accumulated condensate from sump 105. In embodiments employing a wick rather than a valve to remove condensate from sump 105, condensate is purged continuously, thereby eliminating the need to provide control for this operation.

In preferred embodiments, RECU 100 is activated in normal dehumidification mode when the dew point within enclosure 171 exceeds a predetermined setpoint. Dew point sensor 121 monitors the dew point of the air within enclosure 171, and provides a signal indicative of the dew point to controller 130 (input 541, see FIG. 5). Controller 130 periodically monitors the dew point input (FIG. 6, step 639), comparing the dew point input to a predetermined setpoint (FIG. 6, step 640). If controller 130 determines that the dew point is below the setpoint, controller 130 then determines whether the RECU is currently in dehumidification mode (FIG. 6, step 650). Controller 130 makes this determination by monitoring the state of three of its outputs: air moving device on/off (545), heat pump on/off (546), heat pump polarity (547) (see FIG. 5 and Table 1). If the RECU is currently in dehumidification mode, the controller terminates dehumidification mode by turning off heat pump 161 and air moving device 106 (FIG. 6, steps 651 and 652). If the RECU is not in dehumidification mode, no further action is taken during this control cycle.

enters or remains in defrost mode (FIG. 6, steps 610 through 624, explained in detail below). If the pressure is at or below the setpoint, controller 130 insures that the RECU enters or remains in normal (dehumidification) mode (FIG. 6, steps 630 through 634, explained in detail below).

If controller 130 determines that the pressure exceeds the setpoint, indicating frost accumulation on the normally cold heat exchanger 164, controller 130 initiates a sequence of steps placing the RECU in defrost mode, or causes the RECU to remain in defrost mode as appropriate. As shown in FIG. 6, controller 130 compares the input from pressure sensor 123 to a setpoint, at step 605. If the pressure exceeds the setpoint, controller 130 next determines whether the RECU is actively operating in normal (dehumidification) mode, at step 610. Controller 130 makes this determination by monitoring the state of three of its outputs: air moving device on/off (545), heat pump on/off (546), heat pump polarity (547) (see FIG. 5 and Table 1). If the RECU is actively operating in dehumidification mode, controller 130 turns off heat pump 161 and air moving device 106, at steps 611 and 612 respectively. If the RECU is not actively in dehumidification mode (i.e. RECU is inactive, or in defrost mode), steps 611 and 612 are unnecessary. Controller 130 next determines whether the RECU is already in defrost mode, at step 620, by monitoring the state of outputs 545, 546, and 547, as previously noted. If the RECU is already in defrost mode, controller 130 takes no further action during this control cycle, causing the RECU to remain in defrost mode. If the RECU is not yet in defrost mode, controller 130 initiates a sequence of operations placing the RECU in defrost mode. First, controller 130 causes inlet door 109 and outlet door 110 to move into defrost position, step 621, and as illustrated in FIG. 1C. One method of accomplishing this

TABLE 1

| Controller Output | RECU Operational State | | |
|---|---|---|---|
|  | RECU OFF | Dehumidification ON | Defrost ON |
| 545 - Air Moving Device ON/OFF | OFF | ON | ON |
| 546 - Heat Pump ON/OFF | OFF | ON | ON |
| 547 - Heat Pump Polarity | NORMAL | NORMAL | REVERSED |
| 548 - Servo Motor (Inlet/Outlet doors) | NORMAL | NORMAL | DEFROST |

Also in preferred embodiments, the RECU defrost cycle is activated when normally cold heat exchanger 164 becomes frosted. As previously noted, frost accumulation on the surfaces of normally cold heat exchanger 164 impedes or restricts airflow through the heat exchanger. This restricted airflow condition causes an increase in air pressure in the portion of conduit inlet side 103 between the air moving device 106 and the leading edge of normally cold heat exchanger 164. A pressure sensor 123 is placed at this position, as shown in FIGS. 1B and 1C. Thus placed, pressure sensor 123 is properly located to detect an increase in air pressure indicative of frost accumulation on normally cold heat exchanger 164. As shown in FIG. 5, pressure sensor 123 is electrically connected to controller 130 (input 541), providing to controller 130 an electrical signal indicative of the air pressure within conduit inlet side 103 between air moving device 106 and normally cold heat exchanger 164.

Controller 130 periodically monitors the input from pressure sensor 123 (FIG. 6, step 603), comparing the value to a predetermined setpoint (FIG. 6, step 605). If the pressure exceeds the setpoint, controller 130 insures that the RECU result is shown in the schematic of FIG. 5, where controller 130 provides output 548 to a device such as a servo motor 532. Two such servo motors may be used, one for inlet door 109 and a second for outlet door 110. Controller 130 next reverses the direction of heat flow through heat pump 161, step 622. In preferred embodiments, heat pump 161 is a thermoelectric device. As previously noted, controller 130 reverses the heat flow direction through the thermoelectric heat pump by reversing the polarity of the heat pump voltage supply. FIG. 5 illustrates one possible apparatus to control the polarity reversal, TE power switch 531. As defined here, heat pump 161 operates in normal mode (heat flow from normally cold element to normally hot element) when voltage supply V1 exceeds voltage supply V2. Switch 531 has two sets of inputs: two control inputs (heat pump on/off 546, heat pump polarity 547), and two voltage supply inputs (V+,V−). Switch 531 applies the appropriate supply voltages to the heat pump, V1 and V2, based on the control inputs 546 and 547. Table 2 describes the function of switch 531 by illustrating the relationship between control inputs 546 and 547, and heat pump supply voltages V1 and V2. Switch 531 may be implemented using a number of relays, for example, or any switching devices providing the characteristics illustrated in Table 2. At the completion of step 622, the state of switch 531 is described in column 3 of Table 2, corresponding to controller output 546=OFF, controller output 547=REVERSE.

TABLE 2

|    | Output 546 = OFF (Heat Pump OFF) | | Output 546 = ON (Heat Pump ON) | |
|----|----------------|----------------|----------------|----------------|
|    | 547 = NORMAL   | 547 = REVERSE  | 547 = NORMAL   | 547 = REVERSE  |
| V1 | NC             | V−             | V+             | V−             |
| V2 | V−             | NC             | V−             | V+             |

Controller 130 next activates heat pump 161 in the reverse heat flow direction, at step 623. At the completion of step 623, the state of switch 531 is described in column 5 of Table 2, corresponding to controller output 546=ON, controller output 547=REVERSE. In the final step in activating defrost mode, controller 130 turns ON air moving device 106, at step 624. At this point, defrost mode is active: inlet and outlet doors 109 and 110 are in defrost mode position, heat flow direction through heat pump 161 is reversed, heat pump 161 is ON, air moving device 106 is ON.

If, at step 605, controller 130 determines that the pressure (as indicated by pressure sensor 123) is at or below the setpoint, indicating the absence of frost accumulation on the normally cold heat exchanger 164, controller 130 initiates a sequence of steps terminating the RECU defrost mode, or causes the RECU to remain in normal mode as appropriate. As shown in FIG. 6, controller 130 compares the input from pressure sensor 123 to a setpoint, at step 605. If the pressure is at or below the setpoint, controller 130 next determines whether the RECU is actively operating in defrost mode, at step 630. Controller 130 makes this determination by monitoring the state of three of its outputs: air moving device on/off (545), heat pump on/off (546), heat pump polarity (547) (see FIG. 5 and Table 1). If controller 130 determines that the RECU is not actively operating in defrost mode, no further action is taken with respect to the operational mode of the RECU, and controller 130 continues with normal operation by reading dew point sensor 121, at step 639.

If, after determining that the pressure is at or below setpoint (step 605), controller 130 determines that the RECU is actively in defrost mode (step 630), controller 130 initiates a series of steps to terminate defrost mode and return the RECU to dehumidification mode. Controller 130 first turns air moving device 106 OFF, step 631. Controller 130 then turns heat pump 161 OFF, step 632, and reverses the polarity of heat pump supply voltages thereby reversing the direction of heat flow to the normal mode, step 633. As noted previously, under normal operation heat flows from the normally cold element 162 to normally hot element 163. Finally, at step 634, controller 130 returns inlet and outlet doors 109 and 110, respectively, to their normal operating positions. With inlet door 109 in normal operating position, conduit inlet side 103 is in airflow communication with inlet port 111 and therefore with compartment 172. Ambient inlet vent 107 is sealed off from conduit inlet side 103. In similar fashion, with outlet door 110 in normal operating position, conduit outlet side 104 is in airflow communication with outlet port 112 and therefore with compartment 172. Ambient outlet vent 108 is sealed off from conduit outlet side 104.

FIG. 6 illustrates three additional aspects of RECU control. Controller 130 performs an initialization step at startup, step 601. This step insures that all control variables are in a known state: heat pump 161 OFF, air moving device 106 OFF, inlet and outlet door position NORMAL, heat pump 161 heat flow direction NORMAL.

The next aspect illustrated in FIG. 6 involves the control flow for embodiments utilizing automated dehumidification and defrost cycles. In such an embodiment, it is possible for the dew point and pressure inputs to controller 130 to simultaneously exceed their respective setpoints. Since the two operating modes described herein are mutually exclusive, one operating mode should take priority over the other mode. While alternative solutions may be possible, the embodiments described herein prioritize the defrost mode over the dehumidification mode. FIG. 6 illustrates this in the following way: steps 639 and 640 (read and compare dew point sensor) are located in a branch of the control flow that controller 130 reaches only after determining that the pressure is at or below setpoint (step 605). As long as controller 130 determines that pressure exceeds the setpoint, step 605, the RECU remains in defrost mode, and controller 130 does not compare the dew point input to the setpoint (step 640). Further, if the RECU is operating in dehumidification mode when controller 130 determines at step 605 that pressure exceeds the setpoint, controller 130 determines the state of RECU and terminates the active dehumidification mode prior to activating defrost mode (steps 610, 611, and 612).

The remaining aspect illustrated in FIG. 6 involves the use of a delay step 602. Step 602 helps to eliminate oscillations which may be caused by pressure or dew point values fluctuating at or near their respective set points.

Preferred embodiments of the present invention employ control mechanisms for a third operation: purging accumulated condensate from sump 105. As previously noted, in embodiments employing a wick rather than a valve to remove condensate from sump 105, condensate is purged continuously, thereby eliminating the need to provide control for this operation. In embodiments employing a valve to purge condensate, a device such as a solenoid valve (FIG. 1B, 153) is preferably used. As shown in FIG. 5, a liquid level sensor 122 is used to monitor the level of condensate present in sump 105. In the embodiment of FIG. 5, liquid level sensor is in electrical communication with controller 130, providing to controller 130 a signal indicative of the liquid level within sump 105. When the level exceeds a setpoint, controller 130 opens solenoid valve 153, causing condensate to exit sump 105 through condensate drain 152 (see FIG. 1B). Controller 130 determines when to terminate the purge cycle by either monitoring the signal from liquid level sensor 122, or by waiting some period of time after opening solenoid valve 153. Controller 130 then terminates the purge cycle by closing solenoid valve 153. Other arrangements to control purging condensate from sump 105 are, of course, possible. For example, since condensate purge control is independent of the operational state of the RECU (i.e. dehumidification mode, defrost mode, or OFF), it may be desirable to cause liquid level sensor 122 to directly control solenoid valve 153, without involving controller 130. Also for example, mechanical devices could be used to control the purging of condensate.

As will be apparent to one of ordinary skill in the art, other embodiments of the present invention are possible, in keeping with the spirit and scope of the present invention. By way of example, a few of the possible alternative embodiments will now be described. These embodiments are intended as examples, and do not constitute a comprehensive list of embodiments comprehended within the scope of the present invention.

Embodiment Using Alternative Design and Placement of Ports

In the embodiment of FIGS. 1A through 1C, inlet port 111 constitutes a single plane, which is defined by the upper surface of inlet door 109 while in its defrost position (see FIGS. 1B and 1C). Outlet port 112 constitutes a single plane, which is similarly defined by the upper surface of outlet door 110 while in its defrost position. In this embodiment, the primary purpose of inlet and outlet ports 111 and 112 is to define the airflow communication aperture between compartment 172 and conduit inlet and outlet sides 103 and 104, such that inlet and outlet doors 109 and 110 create effective seals when they close against their respective ports.

Figure 3A:
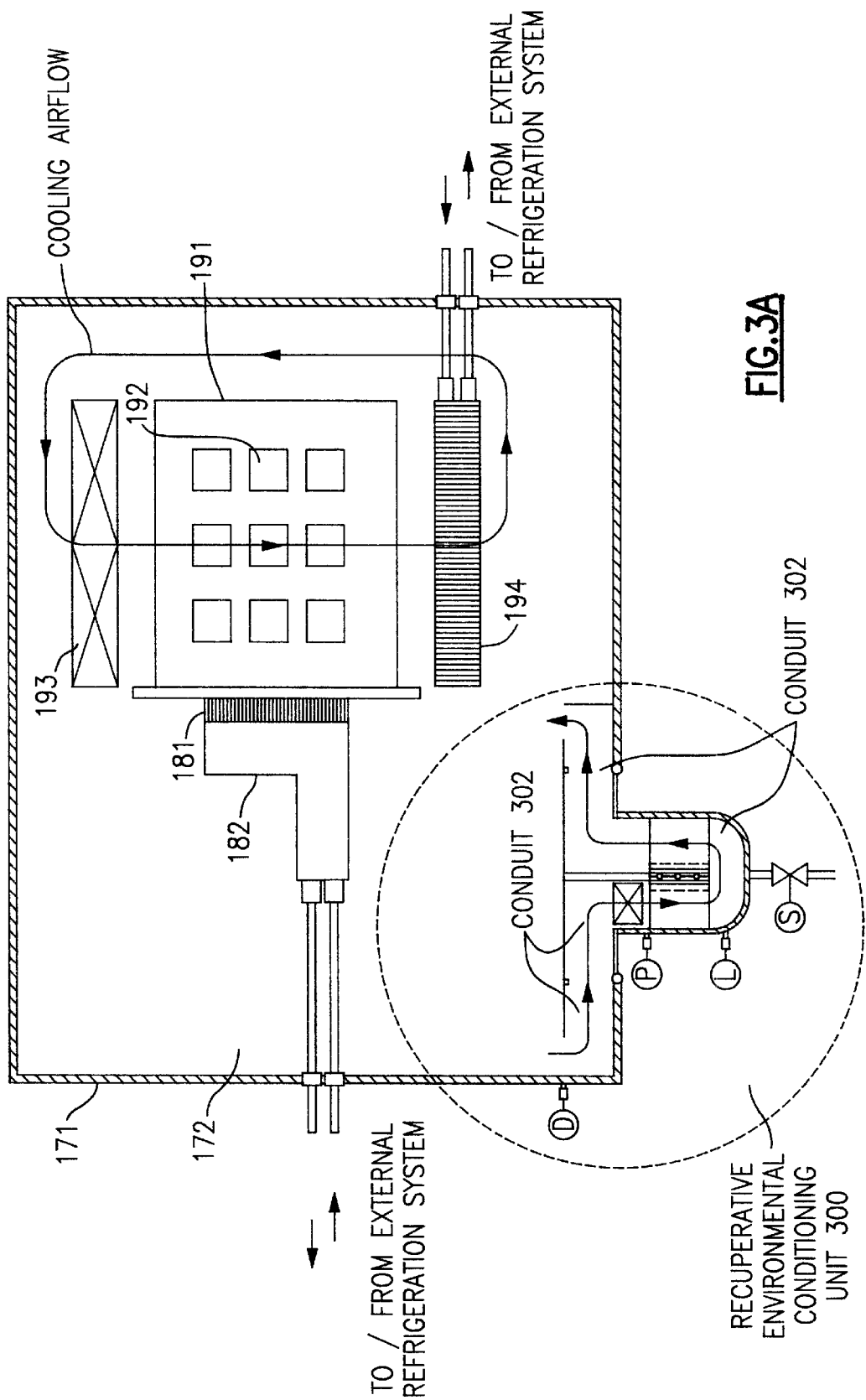
FIG. 3A shows a side view of an electronics enclosure with an external RECU, according to an alternative embodiment of the present invention.

It is possible to modify the inlet and outlet ports, as shown in the embodiment of FIGS. 3A through 3C. FIG. 3A shows an alternative embodiment, RECU 300, employing a conduit 302 with modified inlet and outlet ports. As will be described, this embodiment eliminates the need to extend an airflow baffle into compartment 172, as in the embodiment of FIG. 1A.

FIG. 3B illustrates additional details of the modified conduit 302. In particular, inlet port 311 now comprises some length of the airflow path through conduit 302. In the embodiment of FIG. 3B, inlet port 311 now performs two functions. First, inlet port 311 defines the aperture against which inlet door 309 closes when in defrost position (see FIG. 3C), as did inlet port 111 of FIGS. 1B and 1C. In addition, inlet port 311 now comprises some length of conduit, causing air from compartment 172 to be transported some distance after entering conduit 302, before reaching the conduit inlet side 303. In similar fashion, outlet port 312 as shown in FIG. 3B also performs two functions, defining the aperture against which outlet door 312 closes when in defrost position (again, see FIG. 3C), and transporting air exiting conduit outlet side 304 some distance prior to returning the air to compartment 172. Extending inlet and outlet ports 311 and 312 thus causes air to exit conduit 302 some distance from the location where air enters conduit 20 302. In this way, conduit 302 removes air from compartment 172 some distance from the location where conduit 302 returns air to compartment 172, causing the returning air to circulate through compartment 172 prior to reentering conduit 302. This arrangement of inlet and outlet ports 311 and 312 eliminates the need to extend an airflow baffle (such as baffle 101 of FIG. 1A) into compartment 172.

The dehumidification mode operation of the embodiment illustrated in FIG. 3B is much the same as the dehumidification mode operation of the embodiment illustrated in FIG. 1B. The function and operation of heat pump 161 and associated elements (162 and 163), heat exchangers (164 and 165), sensors (121, 122, 123), air moving device 106, valve 153 and drain 152, and controller 130 are unchanged from the embodiment of FIGS. 1A through 1C. Air moving device 106 creates the airflow through conduit 302, from inlet side 303 to outlet side 304. Air enters inlet port 311 of conduit 302 from compartment 172. Inlet port 311 then directs the flow of air some distance to the aperture connecting inlet port 311 to conduit inlet side 303. As in the embodiment of FIGS. 1A through 1C, air next flows through conduit inlet side 303 where it is cooled and dehumidified by normally cold heat exchanger 164, through sump 305, then through conduit outlet side 304 where the air is heated by normally hot heat exchanger 165. Air exits conduit outlet side 304 through the aperture connecting outlet side 304 to outlet port 312, outlet port 312 then directs the flow of air some distance prior to allowing the air to return to compartment 172.

Inlet and outlet doors 309 and 310, respectively, perform the same functions as the inlet and outlet doors 109 and 110 of the embodiment of FIG. 1B, although doors 309 and 310 are positioned differently than doors 109 and 110. In the normal (i.e. dehumidification) mode shown in FIG. 3B, inlet door 309 is shown in normal operating position. In this position, the aperture connecting inlet port 311 and conduit inlet side 303 remains unobstructed, thereby allowing airflow communication between inlet port 311 and conduit inlet side 303. Inlet door 309 also seals ambient inlet port 307 from conduit inlet side 303. Similarly, FIG. 3B also shows outlet door 310 in normal operating position. In this position, the aperture connecting outlet port 312 to conduit outlet side 304 remains unobstructed, thereby allowing airflow communication between conduit outlet side 304 and outlet port 312. Outlet door 310 also seals ambient outlet vent 308 from conduit outlet side 304.

The defrost mode operation of the embodiment illustrated in FIG. 3C is similar to the defrost mode operation of the embodiment illustrated in FIG. 1C. The function and operation of heat pump 161 and associated elements (162 and 163), heatsinks (164 and 165), sensors (121, 122, 123), air moving device 106, valve 153 and drain 152, and controller 130 are unchanged from the embodiment of FIGS. 1A through 1C. During defrost mode operation of the embodiment shown in FIG. 3C, inlet door 309 moves into defrost position. In this position, inlet door 309 seals the aperture connecting inlet port 311 to conduit inlet side 303, thereby eliminating airflow communication between inlet port 311 and conduit inlet side 303. Ambient inlet vent 307 is now unobstructed, allowing the ambient air surrounding enclosure 171 to enter conduit inlet side 303. Similarly, during defrost mode operation outlet door 310 moves into defrost position. In this position, outlet door 310 seals the aperture connecting outlet port 312 to conduit outlet side 304, thereby eliminating airflow communication between outlet port 312 and conduit outlet side 304. Ambient outlet vent 308 is now unobstructed, venting the air from conduit outlet side 304 into the ambient environment surrounding enclosure 171.

Figure 3D:
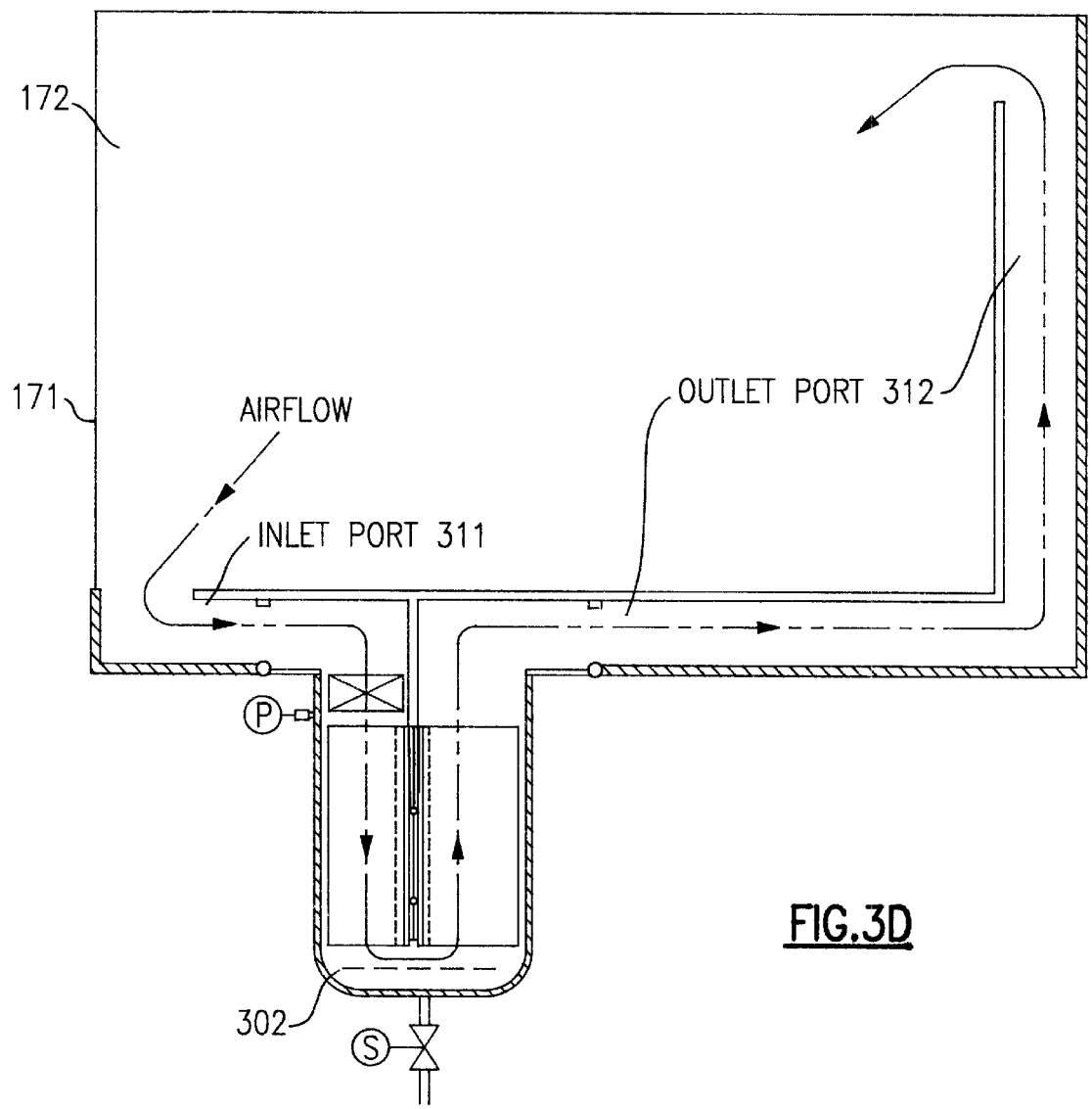
FIG. 3D shows a side detail view of an RECU employing an extended outlet port.

The inlet and outlet ports 311 and 312, respectively, may each extend further, increasing the distance between the point at which air enters conduit 302 and the point at which air exits conduit 302. Increasing this distance improves the flow of air within compartment 372. FIG. 3D illustrates one such embodiment, where outlet port 312 extends the length of the bottom wall of enclosure 171, then up the height of one wall of enclosure 171.

Embodiment Using an Internal Conduit

Figure 4A:
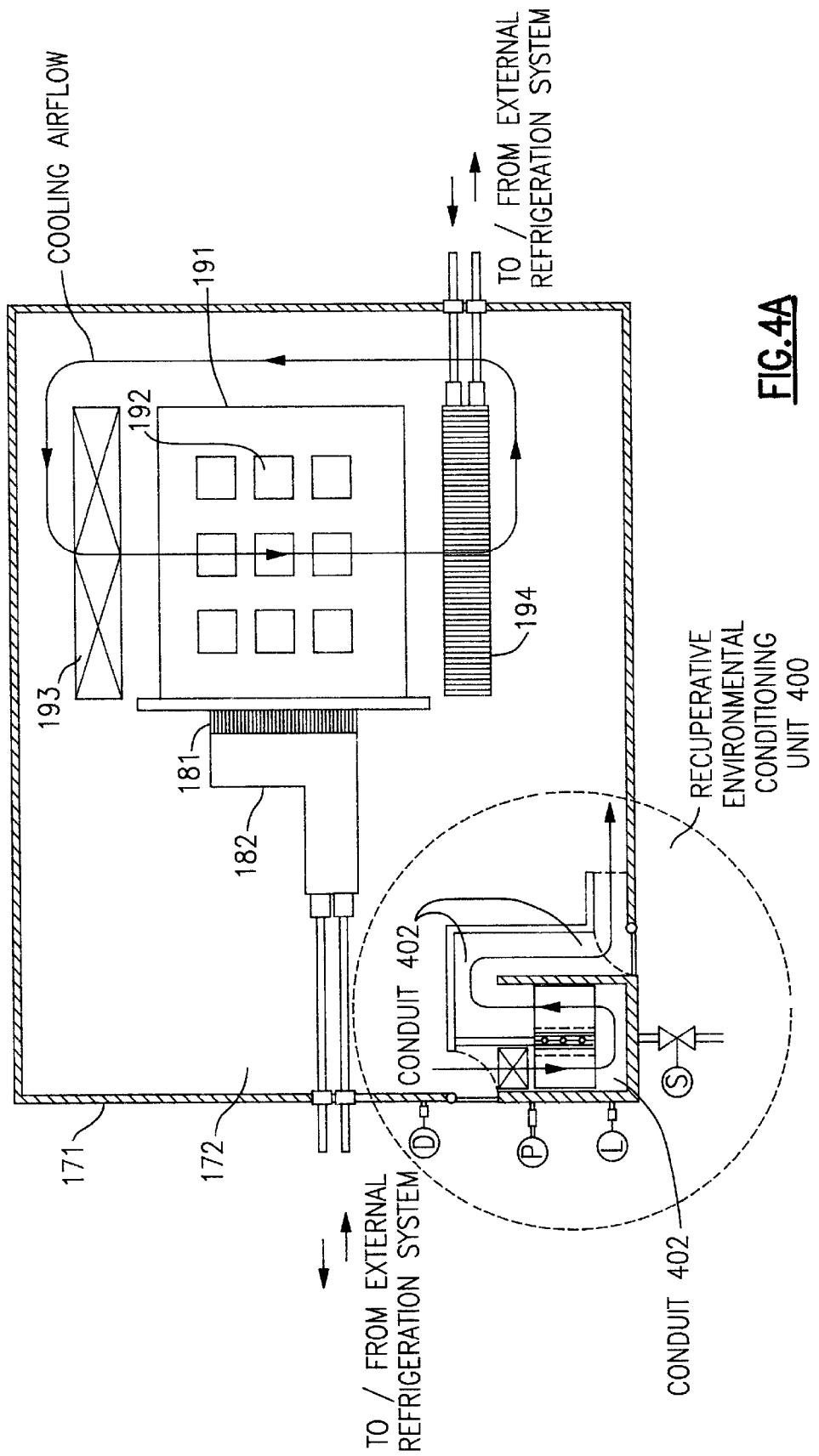
FIG. 4A shows a side view of an electronics enclosure with an internal RECU according to one embodiment of the present invention.

In some applications, it may be desirable or necessary to contain the entire conduit within the electronics closure, requiring only the condensate drain (or some portion thereof) to extend outside the enclosure. FIG. 4A illustrates such an embodiment, where RECU 400 comprises a conduit 402 disposed completely within enclosure 171. As shown here and in FIGS. 4B and 4C, sensors 121, 122, and 123 are shown extending outside of enclosure 171, however this configuration is not a requirement. An alternative embodiment may be envisioned where all sensors are disposed within enclosure 171. Likewise, solenoid valve 153 is shown disposed outside of enclosure 171, however this configuration is also not a requirement. An alternative embodiment may be envisioned where solenoid valve 153 is disposed within enclosure 171, with condensate drain 152 being disposed partially inside enclosure 171, extending through enclosure 171 into the ambient environment, in order to allow removal of condensate from within the enclosure.

Figure 4B:
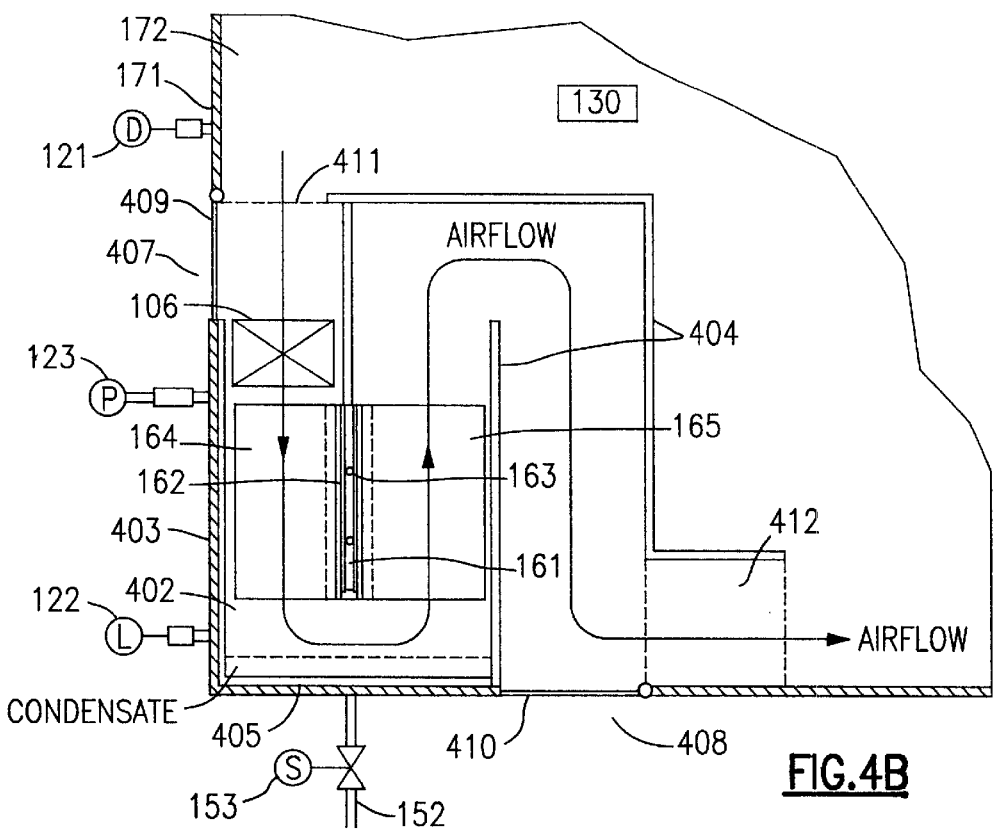
FIG. 4B shows a side detail view of the RECU of FIG. 4A in normal operation.
Figure 4C:
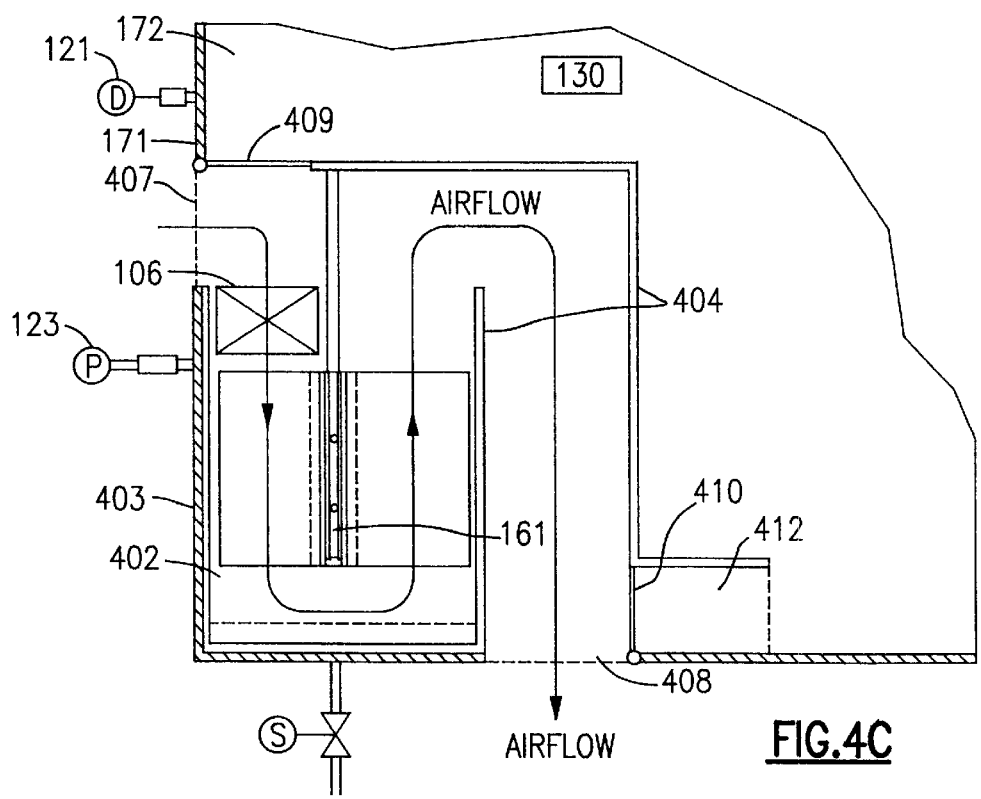
FIG. 4C shows a side detail view of the RECU of FIG. 4A, in defrost mode.

The basic structure of the embodiment of FIGS. 4A through 4C is similar to that of the embodiments previously described. As illustrated in FIG. 4B, conduit 402 comprises an inlet port 411, conduit inlet side 403, sump 405, conduit outlet side 404, and outlet port 412. Inlet door 409 is disposed such that during normal operation door 409 is capable of sealing off ambient inlet vent 407 while inlet port 411 remains in airflow communication with conduit inlet side 403, and such that during defrost mode door 409 is capable of sealing off inlet port 411 while ambient inlet vent 407 is in airflow communication with conduit inlet side 403. Outlet door 410 is analogously disposed to seal ambient outlet vent 408 during normal operation, and to seal outlet port 412 during defrost mode. Conduit inlet side 403, as shown, is similar to conduit inlet side 103 of the embodiment illustrated in FIGS. 1A through 1C. Conduit outlet side 404, however, is extended and doubled back in order to direct airflow toward the bottom wall of enclosure 171 (and ambient outlet vent 408), for easy access to the external ambient during defrost mode. Inlet port 411, as shown in FIG. 4B, is similar in design to inlet port 111 of FIG. 1B. Inlet port 411 provides an aperture connecting compartment 172 to conduit inlet side 403, where the aperture is capable of being sealed off by inlet door 409 during defrost mode. Outlet port 412, as shown in FIG. 4B, is similar in design to outlet port 312 of FIG. 3B, since outlet port 312 also directs the air exiting conduit outlet side 404 some distance after the sealable aperture before allowing the air to reenter compartment 172.

As is readily apparent to one of ordinary skill in the art, the features of the conduit inlet and outlet sides 403 and 404, and the inlet and outlet ports 411 and 412 illustrated in FIG. 4B may be interchanged or modified, in keeping with the spirit and scope of the present invention. For example, conduit inlet side 403 could be extended and doubled back instead of conduit outlet side 404, or both sides 403 and 404 could be extended and doubled back to allow freestanding placement of conduit 402 away from enclosure walls. Also for example, inlet port 411 could be extended as in the embodiment of FIG. 3B.

The dehumidification mode operation of the embodiment illustrated in FIG. 4B is much the same as the dehumidification mode operation of the embodiment illustrated in FIG. 1B. The function and operation of heat pump 161 and associated elements (162 and 163), heatsinks (164 and 165), sensors (121, 122, 123), air moving device 106, valve 153 and drain 152, and controller 130 are unchanged from the embodiment of FIGS. 1A through 1C. Air moving device 106 creates the airflow through conduit 402. Air enters inlet port 411 of conduit 402 from compartment 172, then flows into conduit inlet side 403. As in the embodiment of FIGS. 1A through 1C, air next flows through conduit inlet side 403 where it is cooled and dehumidified by normally cold heat exchanger 164, through sump 405, then through conduit outlet side 404 where the air is heated by normally hot heat exchanger 165. Conduit outlet side 404 redirects the air toward the bottom wall of enclosure 171, where the air exits conduit outlet side 404 through the aperture connecting outlet side 404 to outlet port 412, outlet port 412 then directs the flow of air some distance prior to allowing the air to return to compartment 172.

The defrost mode operation of the embodiment illustrated in FIG. 4C is similar to the defrost mode operation of the embodiment illustrated in FIG. 1C. The function and operation of heat pump 161 and associated elements (162 and 163), heatsinks (164 and 165), sensors (121, 122, 123), air moving device 106, valve 153 and drain 152, and controller 130 are unchanged from the embodiment of FIGS. 1A through 1C. During defrost mode operation of the embodiment shown in FIG. 4C, inlet door 409 moves into defrost position. In this position, inlet door 409 seals the aperture connecting inlet port 411 to conduit inlet side 403, thereby eliminating airflow communication between inlet port 411 and conduit inlet side 403. Ambient inlet vent 407 is now unobstructed, allowing the ambient air surrounding enclosure 171 to enter conduit inlet side 403. Similarly, during defrost mode operation outlet door 410 moves into defrost position. In this position, outlet door 410 seals the aperture connecting outlet port 412 to conduit outlet side 404, thereby eliminating airflow communication between outlet port 412 and conduit outlet side 404. Ambient outlet vent 408 is now unobstructed, venting the air from conduit outlet side 404 into the ambient environment surrounding enclosure 171.

Embodiment Using Vapor Compression Cycle Heat Pump

As previously noted, in preferred embodiments heat pump 161 is a thermoelectric device. Embodiments of the present invention are envisioned, however where the heat pump is a vapor compression cycle heat pump.

Figure 8A:
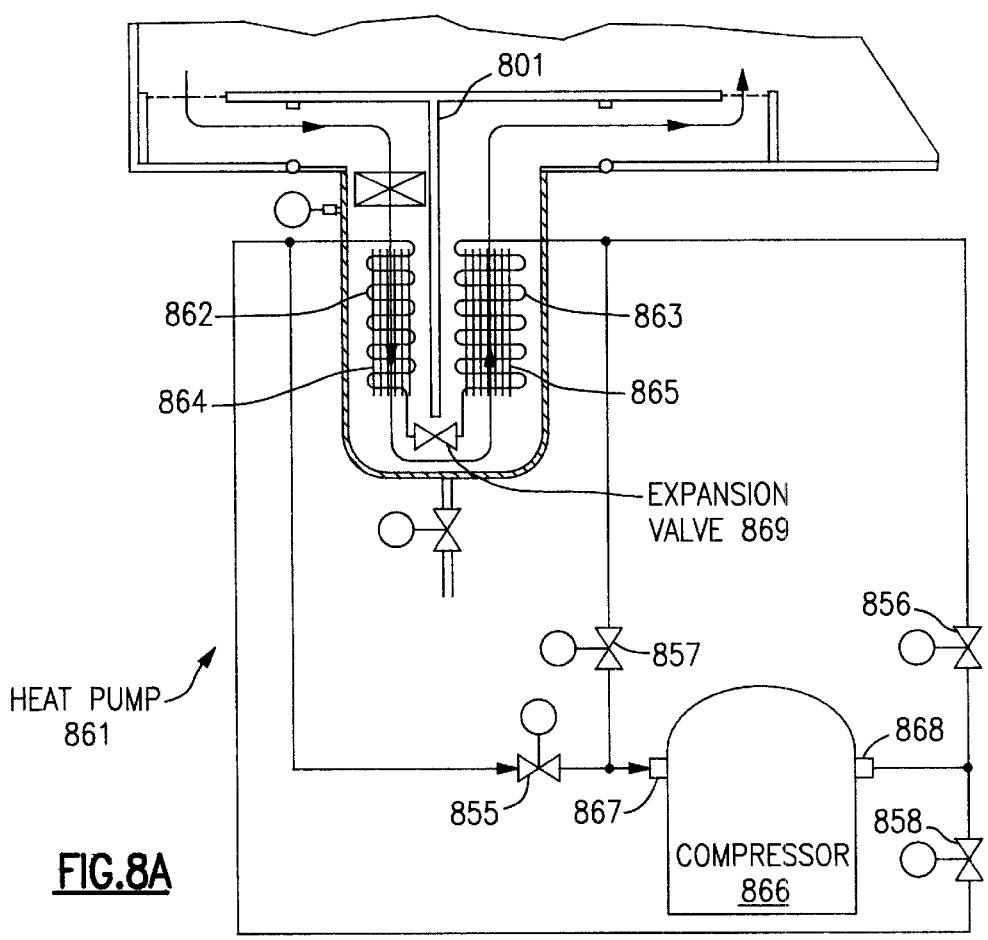
FIG. 8A shows an RECU using a vapor compression cycle heat pump according to one embodiment of the present invention.

FIGS. 8A through 8D illustrate an embodiment of the present invention utilizing an air-to-air reversing vapor-compression heat pump configuration in place of a thermoelectric heat pump. As shown in FIG. 8A, within conduit 302 the thermoelectric module and heat exchanger assembly is replaced by two finned-tube heat exchangers which are separated by baffle 801. Normally cold element 862 is comprised of a serpentine tube disposed within conduit inlet side 303. Normally cold heat exchanger 864 is comprised of a series of fins in thermal contact with normally cold element 862 and also in thermal contact with the air within conduit inlet side 303. In similar fashion, normally hot element 863 is comprised of a serpentine tube disposed within conduit outlet side 304. Normally hot heat exchanger 865 is comprised of a series of fins in thermal contact with normally hot element 863 and also in thermal contact with the air within conduit outlet side 304. As shown in FIG. 8A, the fins of both heat exchangers 864 and 865 are oriented in the direction of airflow through conduit inlet and outlet sides, 303 and 304, respectively. Baffle 801 extends from the front wall of conduit 302 to the rear wall of conduit 302, in the same fashion as baffle 101 of FIG. 2C. Baffle 801 extends the length of conduit inlet and outlet sides 303 and 304, as shown, thereby insuring airflow through both heat exchangers 864 and 865. An additional element, an expansion valve 869, is placed in the tubing connecting the two heat pump elements 862 and 863. A compressor 866, which is disposed outside of conduit 302, receives low pressure refrigerant at low pressure inlet 867, compresses the refrigerant, and delivers high pressure refrigerant to high pressure outlet 868. Each heat pump element 862 and 863 is connected to both compressor ports through a series of four tubing lines as shown in FIG. 8A. Four electrically operated solenoid valves are provided, 855 through 858, to control the flow of refrigerant from compressor 866 to elements 862 and 863, and back to compressor 866. The remaining features of this embodiment are unchanged from the embodiment of FIGS. 3A through 3D.

Figure 8B:
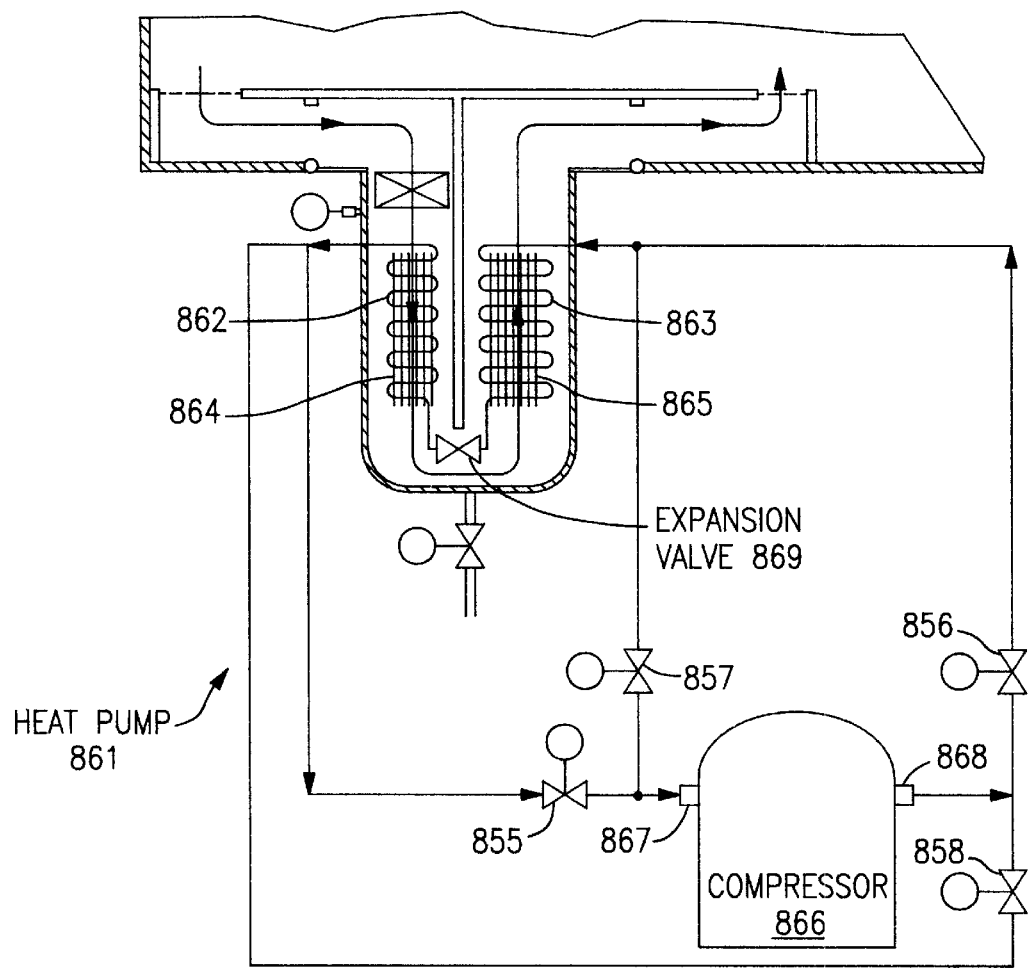
FIG. 8B shows the operation of the embodiment of FIG. 8A during normal operation.

FIG. 8B illustrates the operation of this embodiment of the RECU during normal (dehumidification) mode, focusing primarily on the operation of heat pump 861. Table 3 shows the state of solenoid valves 855 through 858 as a function of controller 130 output 547 (heat pump polarity). In particular, Table 3 column 2 shows the state of solenoid valves 855 through 858 during normal operation: valves 855 and 856 are OPEN, and valves 857 and 858 are CLOSED. Compressed refrigerant gas exits the high pressure outlet 868 of compressor 866. Solenoid valve 856 directs the high pressure refrigerant to normally hot element 863. Normally hot element 863 acts as a condenser, transferring heat from the condensing refrigerant to normally hot heat exchanger 865, which then transfers heat to the air within conduit exit side 304. Liquid refrigerant exits normally hot element 863 and flows through expansion valve 869, thereby substantially reducing the temperature of the liquid refrigerant. The low temperature liquid refrigerant then enters normally cold element 862, which functions as an evaporator during normal operation. Within normally cold element 862 (now an evaporator), low temperature liquid refrigerant absorbs heat from normally cold heat exchanger 864, which in turn absorbs heat from the air within conduit inlet side 303. As a result of absorbing heat, the refrigerant exits normally cold element 862 as a higher temperature gas. Solenoid valve 855, OPEN during normal operation, directs the gaseous refrigerant back to compressor 866, through low pressure inlet 867.

TABLE 3

| | Controller 130 Output 547: Heat Pump Polarity | |
| --- | --- | --- |
| Solenoid Valve | Normal | Reversed |
| Valve 855 | OPEN | CLOSED |
| Valve 856 | OPEN | CLOSED |
| Valve 857 | CLOSED | OPEN |
| Valve 858 | CLOSED | OPEN |

Figure 8C:
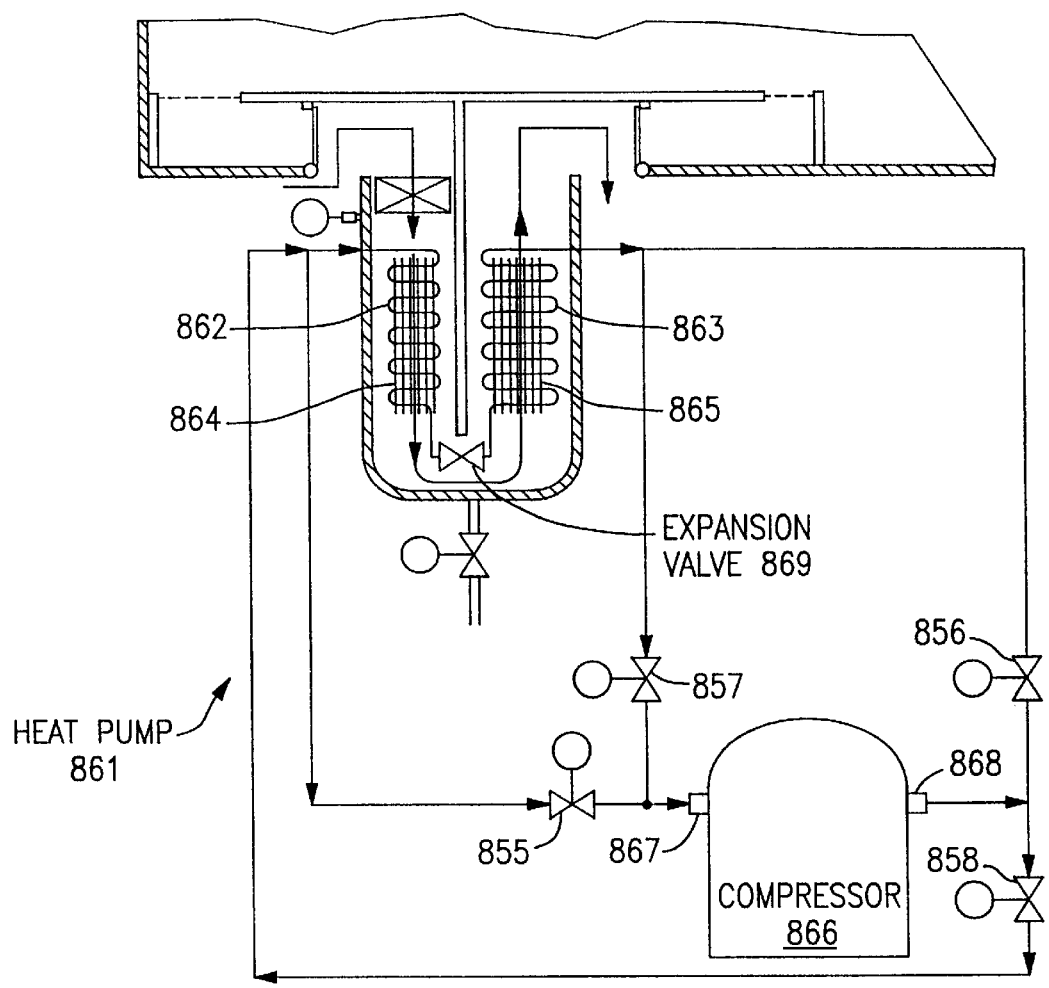
FIG. 8C shows the operation of the embodiment of FIG. 8A during defrost mode.

FIG. 8C illustrates the operation of this embodiment of the RECU during defrost mode, again focusing primarily on the operation of heat pump 861. As previously noted, during normal operation frost may accumulate on normally cold heat exchanger 864, thus impeding airflow through the RECU. The defrost mode removes accumulated frost, as previously described. In order to remove frost, the polarity of heat pump 861 is reversed, causing the normally hot element to become cold and the normally cold element to become hot. In the embodiment of FIG. 8C, this polarity reversal is accomplished by changing the state of solenoid valves 855 through 858, as shown in Table 3. In particular, Table 3 column 3 shows the state of solenoid valves 855 through 858 during defrost mode: valves 855 and 856 are CLOSED, and valves 857 and 858 are OPEN. Changing the state of solenoid valves 855 through 858 reverses the flow of refrigerant through elements 862 and 863, thereby reversing the elements' roles. Compressed, high pressure refrigerant gas exits the high pressure outlet 868 of compressor 866. Solenoid valve 858 now directs the high pressure refrigerant to normally cold element 862. During defrost mode, therefore, normally cold element 862 acts as a condenser (rather than an evaporator), and therefore absorbs heat from the high pressure refrigerant gas. The heat thus absorbed is transferred to normally cold (now hot) heat exchanger 864, thereby causing the accumulated frost to melt. Liquid refrigerant exits the condenser (normally cold element 862) and flows through expansion valve 869, substantially reducing the temperature of the liquid refrigerant. The low temperature liquid refrigerant then enters normally hot element 863, which acts as an evaporator (rather than a condenser) during defrost mode. As previously described, refrigerant exits the evaporator (now normally hot element 863) as a higher temperature gas. Solenoid valve 857, OPEN during defrost mode, directs the gaseous refrigerant back to compressor 866, through low pressure inlet 867.

Figure 8D:
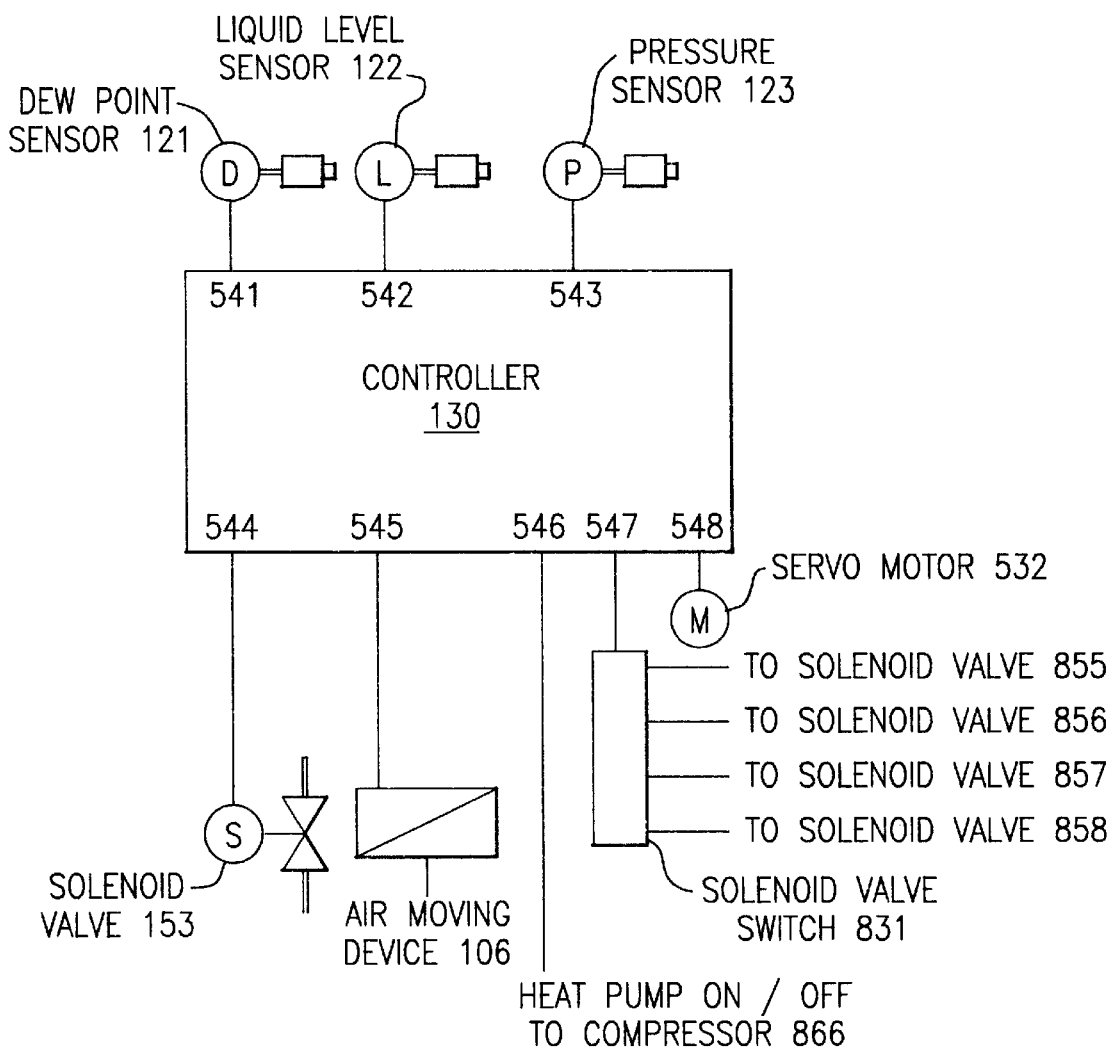
FIG. 8D shows a control schematic for the embodiment of FIGS. 8A through 8C.

The embodiment of FIGS. 8A through 8C may be controlled in much the same manner as previously described. FIG. 8D illustrates a schematic diagram of the control devices of the present embodiment. The function of sensors 121 through 123, controller 130, solenoid valve 143, air moving device 106, and servo motor(s) 532 is unchanged from the embodiment of FIG. 5A. TE switch 531 is replaced by switch 831, which controls solenoid valves 855 through 858 based on the state of controller 130 output 547 (heat pump polarity), as described in Table 3. Switch 831 may be comprised of a series of relays, for example. Controller output 546, heat pump ON/OFF, now controls compressor 866.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An apparatus for conditioning the air surrounding cooled electronic modules, said apparatus comprising:

an enclosure containing said electronic modules, said enclosure being substantially sealed against ingress of ambient air;

a heat pump having a normally cold element and a normally hot element, said heat pump capable of causing heat to flow from said normally cold element to said normally hot element;

a conduit having an inlet port, an outlet port, an inlet side, an outlet side, and a sump, said inlet and outlet ports being in airflow communication with said enclosure, said inlet port normally being in airflow communication with said inlet side, said outlet port normally being in airflow communication with said outlet side, said sump portion being in airflow communication with said inlet and outlet sides, said sump also being disposed beneath said normally cold element;

a normally cold heat exchanger in thermal contact with said normally cold element, said normally cold heat exchanger disposed within said inlet side and providing heat flow between said normally cold element and air within said inlet side;

a normally hot heat exchanger in thermal contact with said normally hot element, said normally hot heat exchanger disposed within said outlet side and providing heat flow between said normally hot element and air within said outlet side;

an air moving device, capable of causing airflow from said inlet side to said outlet side;

enclosure airflow control, capable of causing air exiting said outlet port to circulate within said enclosure before entering said inlet port;

removal means for removing condensate from said sump portion.

2. The apparatus of claim 1, in which said heat pump is a thermoelectric device.

3. The apparatus of claim 1, in which said heat pump is a vapor compression cycle heat pump.

4. The apparatus of claim 1, further comprising;

a dew point sensor;

a controller in electronic communication with said dew point sensor;

said dew point sensor being capable of measuring the dew point of air within said enclosure, said dew point sensor providing as input to said controller a signal indicative of said dew point, said controller monitoring said dew point input and controlling said air moving device and said heat pump accordingly to maintain said dew point below an upper limit.

5. The apparatus of claim 1, in which said conduit is disposed outside of said enclosure.

6. The apparatus of claim 1, in which said removal means is a wick.

7. The apparatus of claim 1, in which said removal means is a valve.

8. The apparatus of claim 7, further comprising:

a liquid level sensor to determine the condensate level present within said sump portion;

a valve controller to open said valve when said condensate level reaches an upper limit.

9. The apparatus of claim 1, in which said enclosure airflow control comprises a baffle disposed between said inlet port and said outlet port.

10. The apparatus of claim 1, in which said enclosure airflow control comprises extending one or more of said ports such that the location at which air flows from said enclosure into said inlet port is distant from the location at which air flows from said outlet port into said enclosure.

11. The apparatus of claim 1, in which said air moving device is placed within said inlet side.

12. The apparatus of claim 1, in which said electronic modules are cooled to temperatures below the dew point temperature of the ambient air surrounding said enclosure.

13. The apparatus of claim 1, further comprising:

a pressure sensor to sense restricted airflow through said heat exchanger in thermal contact with said normally cold element;

heat pump polarity control to reverse the flow of heat in said heat pump, causing heat to flow from said normally hot element to said normally cold element;

conduit airflow control capable of placing said inlet side and outlet side in airflow communication with ambient air surrounding said enclosure, said conduit airflow control further capable of eliminating airflow communication between said inlet side and said inlet port, said conduit airflow control further eliminating airflow communication between said outlet side and said outlet port;

a controller to monitor said pressure sensor for a restricted airflow condition, said controller controlling said heat pump polarity control and said conduit airflow control, said controller activating said heat pump polarity control and said conduit airflow control upon detection of said restricted airflow condition.

14. The apparatus of claim 13, in which said air moving device is disposed within said inlet side, and said pressure sensor is disposed between said air moving device and said normally cold heat exchanger.

15. An apparatus for conditioning the air surrounding cooled electronic modules, said apparatus comprising:

an enclosure containing said electronic modules, said enclosure being substantially sealed against ingress of ambient air;

a heat pump having a normally cold element and a normally hot element, said heat pump capable of causing heat to flow from said normally cold element to said normally hot element;

a conduit having an inlet port, an outlet port, an inlet side, an outlet side, and a sump, said inlet and outlet ports being in airflow communication with said enclosure, said inlet port normally being in airflow communication with said inlet side, said outlet port normally being in airflow communication with said outlet side, said sump portion being in airflow communication with said inlet and outlet sides, said sump also being disposed beneath said normally cold element;

a normally cold heat exchanger in thermal contact with said normally cold element, said normally cold heat exchanger disposed within said inlet side and providing heat flow between said normally cold element and air within said inlet side;

a normally hot heat exchanger in thermal contact with said normally hot element, said normally hot heat exchanger disposed within said outlet side and providing heat flow between said normally hot element and air within said outlet side;

an air moving device, capable of causing airflow from said inlet side to said outlet side;

enclosure airflow control, capable of causing air exiting said outlet port to circulate within said enclosure before entering said inlet port.

16. The apparatus of claim 15, in which said enclosure is hermetically sealed.

17. A method of conditioning air surrounding cooled electronic modules within an electronics enclosure, said method comprising:

substantially sealing the enclosure against ingress of ambient air; cooling a portion of the enclosure air by extracting heat from the portion of air;

condensing water vapor from the cooled portion of air, heating the portion of air by adding heat extracted from one or more portions of enclosure air;

collecting condensate created by said condensing;

purging the condensate; and cooling at least one of the electronic modules within the electronics enclosure.

18. The method of claim 17 further comprising the steps of:

measuring the dew point of the air within said enclosure;

comparing the dew point to a set point;

initiating said cooling, condensing, and heating steps when said measuring indicates that the dew point exceeds the set point;

terminating said cooling, condensing, and heating steps when said measuring indicates that the dew point does not exceed the set point.

19. The method of claim 17, wherein said cooling comprises cooling at least one of the electronic modules within the electronics enclosure to a temperature below a dew point of ambient air surrounding the electronics enclosure.

20. The method of claim 17 further comprising the steps of:

heating frozen condensate;

collecting condensate melted by said heating frozen condensate;

venting to the ambient environment moisture vaporized by said heating frozen condensate.

* * * * *